US011482626B2

(12) United States Patent
Yamazaki et al.

(10) Patent No.: US 11,482,626 B2
(45) Date of Patent: Oct. 25, 2022

(54) SEMICONDUCTOR DEVICE AND MANUFACTURING METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Kenichi Okazaki, Tochigi (JP); Masami Jintyou, Tochigi (JP); Takahiro Iguchi, Tochigi (JP); Yukinori Shima, Gunma (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 16/982,182

(22) PCT Filed: Mar. 15, 2019

(86) PCT No.: PCT/IB2019/052105
§ 371 (c)(1),
(2) Date: Sep. 18, 2020

(87) PCT Pub. No.: WO2019/186315
PCT Pub. Date: Oct. 3, 2019

(65) Prior Publication Data
US 2021/0028313 A1    Jan. 28, 2021

(30) Foreign Application Priority Data
Mar. 29, 2018   (JP) .............................. JP2018-064931

(51) Int. Cl.
*H01L 29/786* (2006.01)
*H01L 27/15* (2006.01)
(Continued)

(52) U.S. Cl.
CPC ........ *H01L 29/7869* (2013.01); *H01L 27/156* (2013.01); *H01L 27/3276* (2013.01); *H01L 29/66969* (2013.01)

(58) Field of Classification Search
CPC ..................... H01L 29/7869; H01L 29/66969
See application file for complete search history.

(56) References Cited

U.S. PATENT DOCUMENTS

| 9,406,760 B2 | 8/2016 | Shimomura et al. |
| 9,559,174 B2 | 1/2017 | Shimomura et al. |

(Continued)

FOREIGN PATENT DOCUMENTS

| CN | 104867981 A | 8/2015 |
| CN | 108292683 A | 7/2018 |

(Continued)

OTHER PUBLICATIONS

English translation of the WIPO written opinion (Year: 2019).*

(Continued)

*Primary Examiner* — Vincent Wall
(74) *Attorney, Agent, or Firm* — Nixon Peabody LLP; Jeffrey L. Costellia

(57) ABSTRACT

A semiconductor device with favorable electrical characteristics is provided. A semiconductor device having stable electrical characteristics is provided. The semiconductor device includes a semiconductor layer containing a metal oxide, a first insulating layer, a second insulating layer, a third insulating layer containing a nitride, and a first conductive layer. The first insulating layer includes a projecting first region that overlaps with the semiconductor layer and a second region that does not overlap with the semiconductor layer and is thinner than the first region. The second insulating layer is provided to cover a top surface of the second region, a side surface of the first region, and the semicon- (Continued)

ductor layer. The first conductive layer is provided over the second insulating layer and a bottom surface of the first conductive layer over the second region includes a portion positioned below a bottom surface of the semiconductor layer.

10 Claims, 22 Drawing Sheets

(51) Int. Cl.
*H01L 27/32* (2006.01)
*H01L 29/66* (2006.01)

(56) References Cited

U.S. PATENT DOCUMENTS

| | | | |
|---|---|---|---|
| 9,905,598 | B2 | 2/2018 | Yamazaki et al. |
| 10,032,928 | B2 | 7/2018 | Shimomura et al. |
| 10,050,152 | B2 | 8/2018 | Yamazaki |
| 10,134,914 | B2 | 11/2018 | Yamazaki et al. |
| 2008/0254613 | A1 | 10/2008 | Li et al. |
| 2011/0240998 | A1 | 10/2011 | Morosawa et al. |
| 2013/0320334 | A1 | 12/2013 | Yamazaki et al. |
| 2014/0361293 | A1* | 12/2014 | Yamazaki ......... H01L 29/78696 257/43 |
| 2015/0008428 | A1 | 1/2015 | Yamamoto et al. |
| 2015/0205194 | A1 | 7/2015 | Lin et al. |
| 2015/0243738 | A1 | 8/2015 | Shimomura et al. |
| 2015/0280013 | A1 | 10/2015 | Yamazaki et al. |
| 2015/0311245 | A1* | 10/2015 | Yamazaki ......... H01L 27/14643 257/43 |
| 2017/0179293 | A1 | 6/2017 | Yamazaki |
| 2017/0263783 | A1 | 9/2017 | Yamazaki et al. |
| 2018/0019343 | A1 | 1/2018 | Asami |
| 2018/0350994 | A1 | 12/2018 | Hosaka et al. |
| 2019/0103497 | A1 | 4/2019 | Yamazaki |

FOREIGN PATENT DOCUMENTS

| | | |
|---|---|---|
| JP | 2011-228622 A | 11/2011 |
| JP | 2014-007399 A | 1/2014 |
| JP | 2015-216369 A | 12/2015 |
| JP | 2016-074580 A | 5/2016 |
| JP | 2017-112374 A | 6/2017 |
| JP | 2018-006734 A | 1/2018 |
| KR | 2015-0099467 A | 8/2015 |
| KR | 2015-0122589 A | 11/2015 |
| KR | 2018-0084819 A | 7/2018 |
| KR | 2018-0123028 A | 11/2018 |
| TW | 201 543660 | 11/2015 |
| TW | 201544458 | 12/2015 |
| WO | WO-2017/085591 | 5/2017 |
| WO | WO-2017/153882 | 9/2017 |

OTHER PUBLICATIONS

International Search Report (Application No. PCT/IB2019/052105) Dated Jun. 25, 2019.
Written Opinion (Application No. PCT/IB2019/052105) Dated Jun. 25, 2019.

* cited by examiner

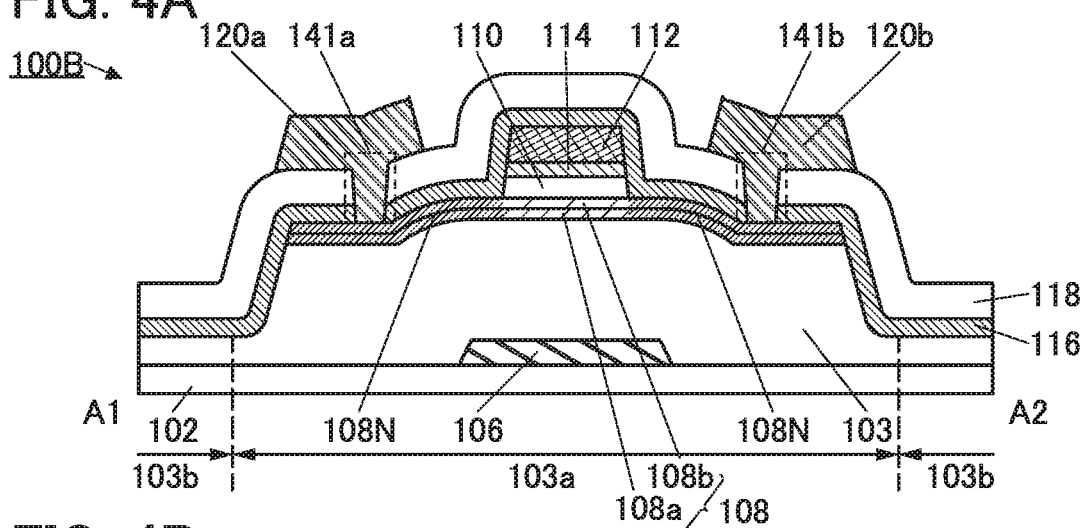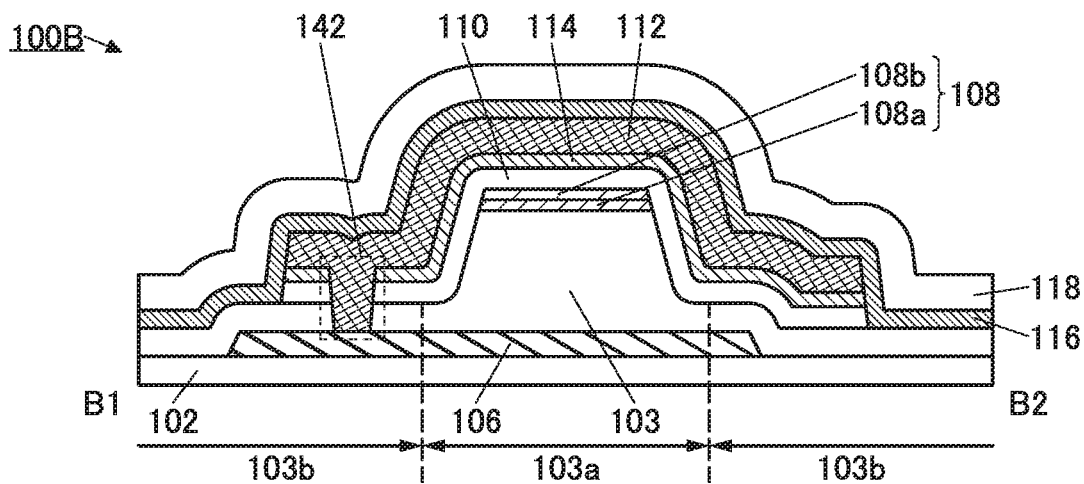

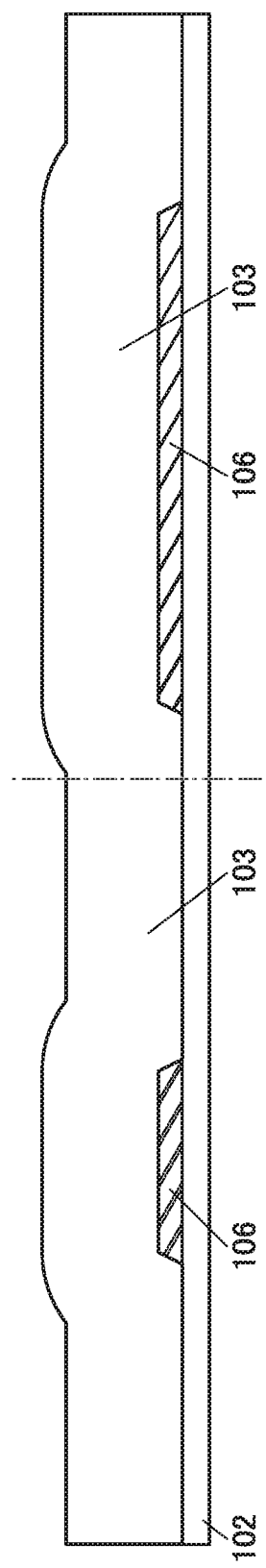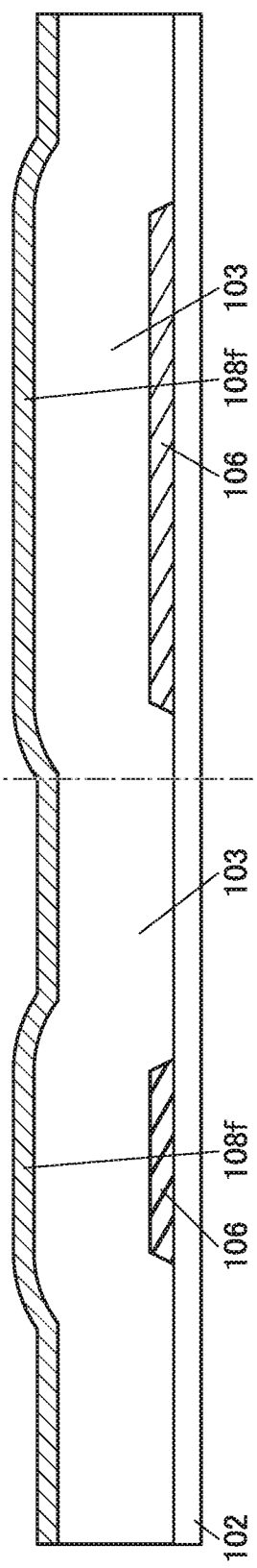

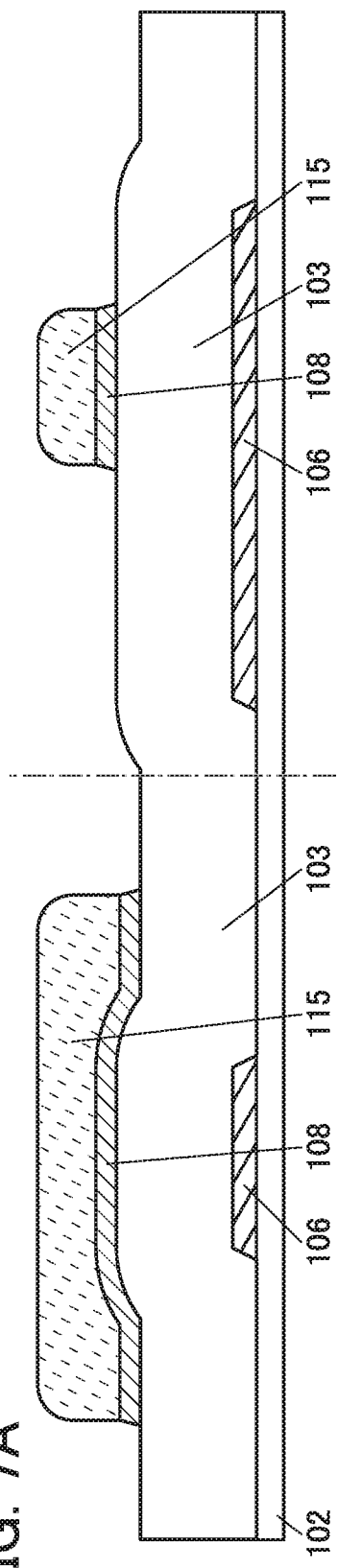
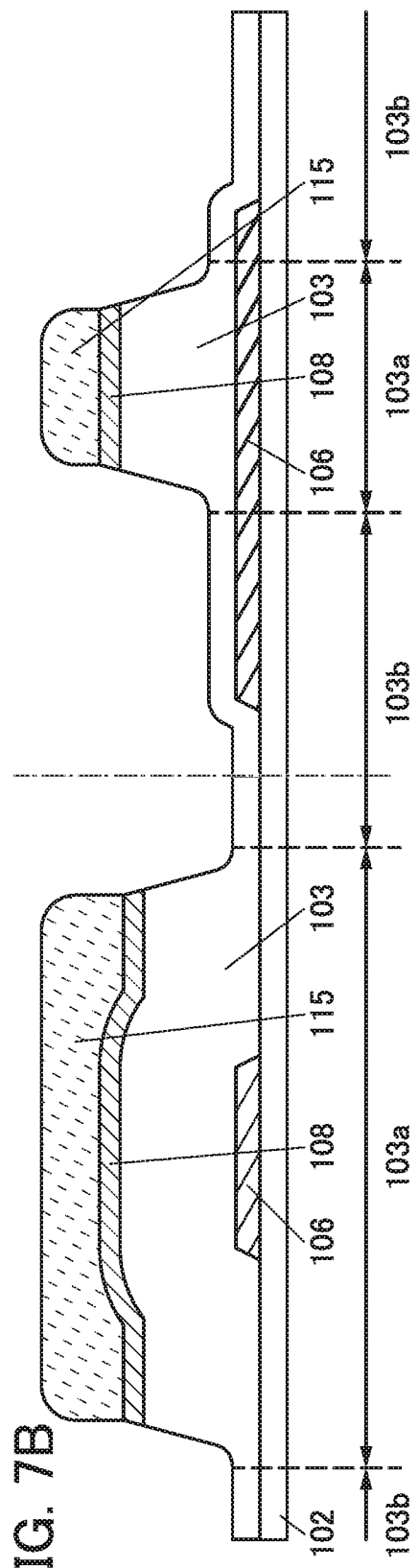

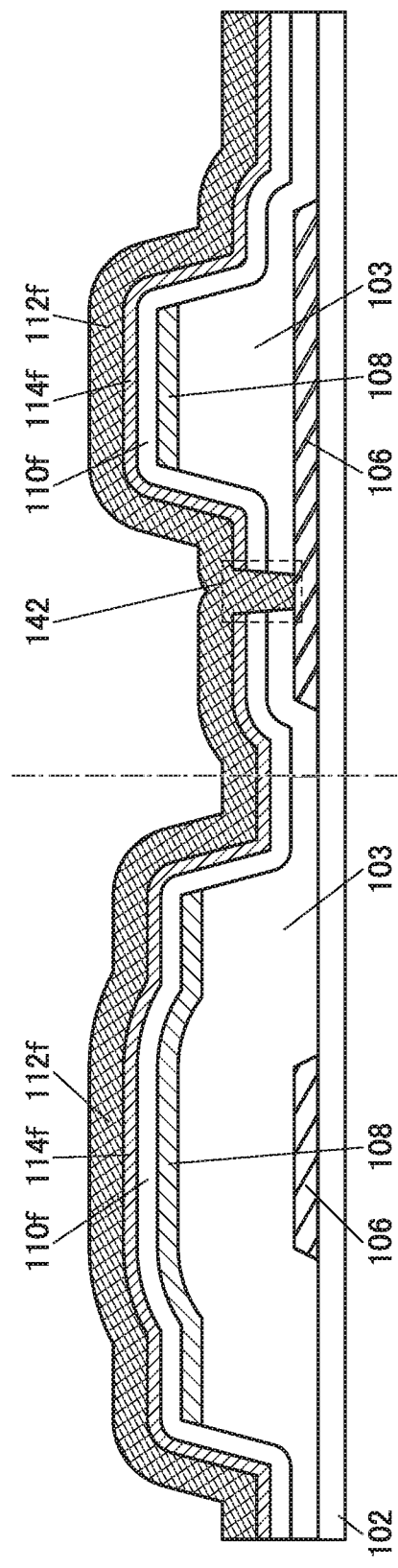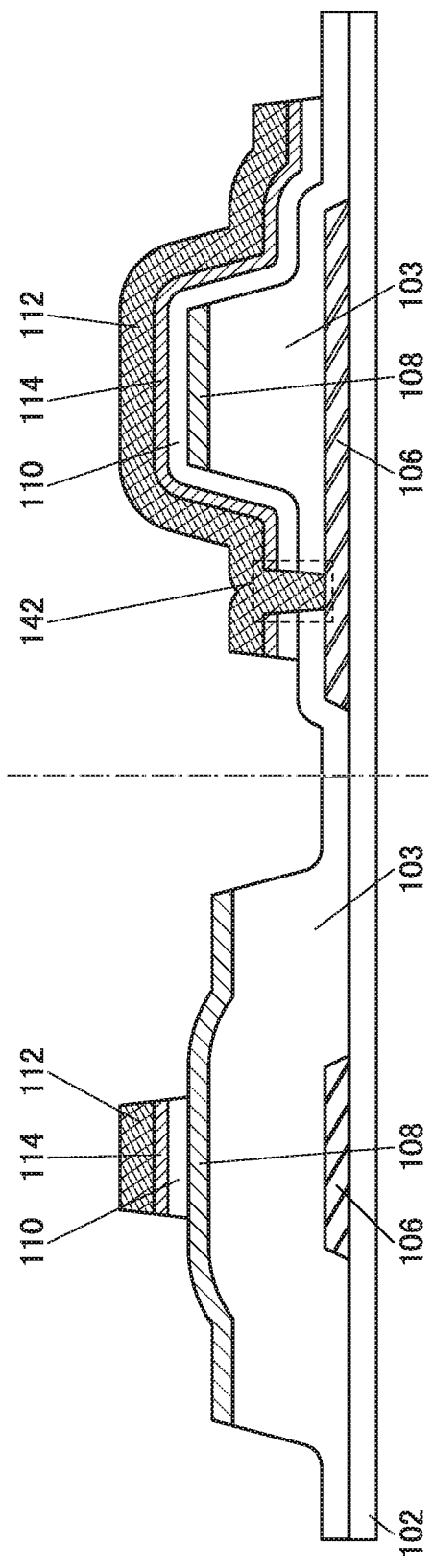

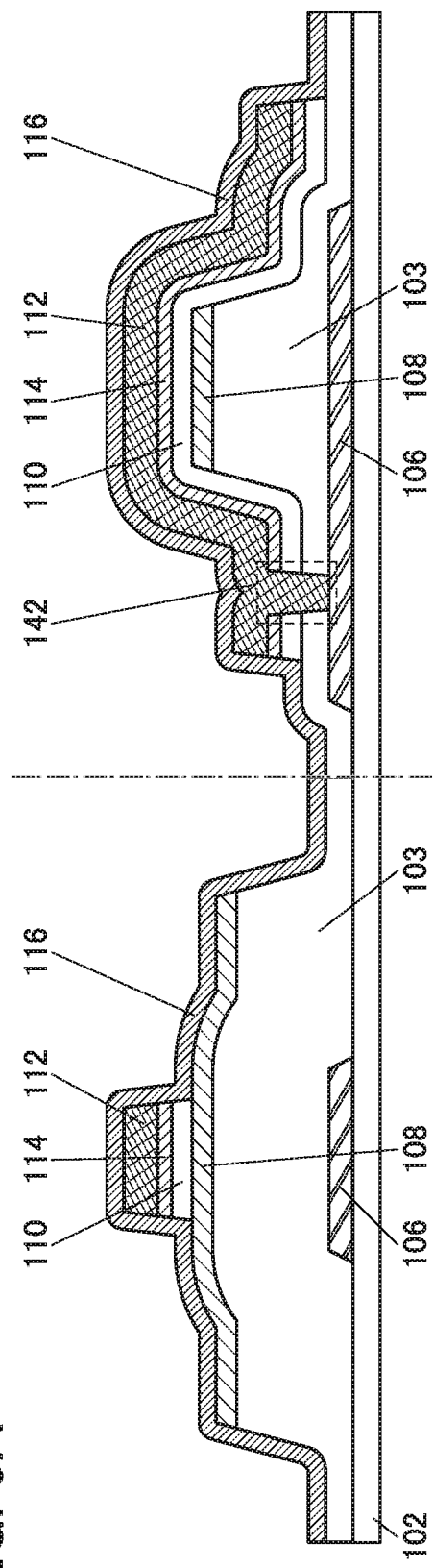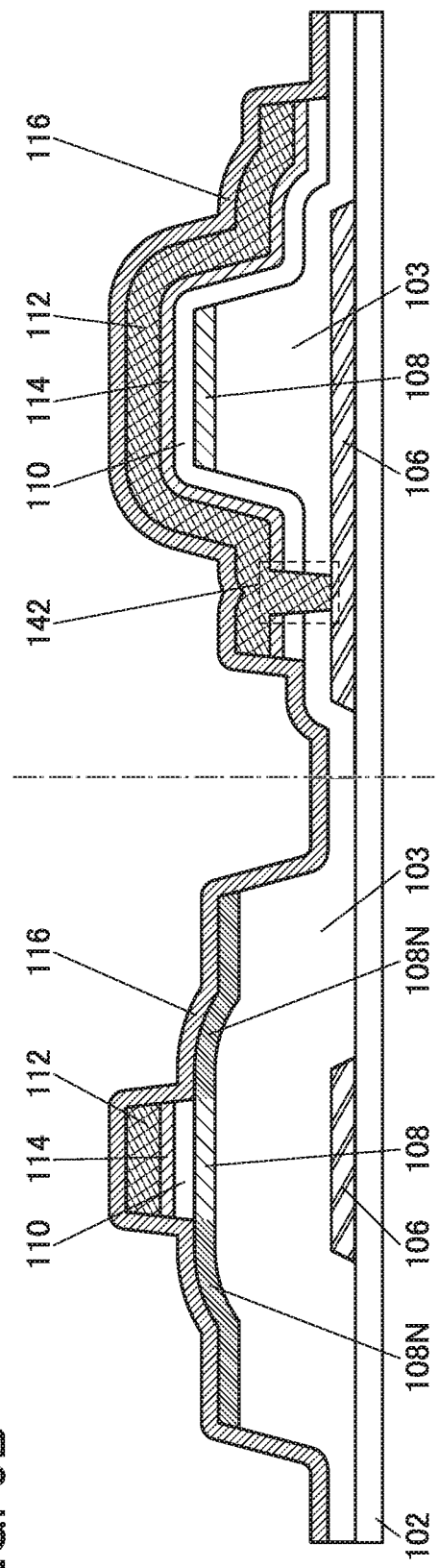

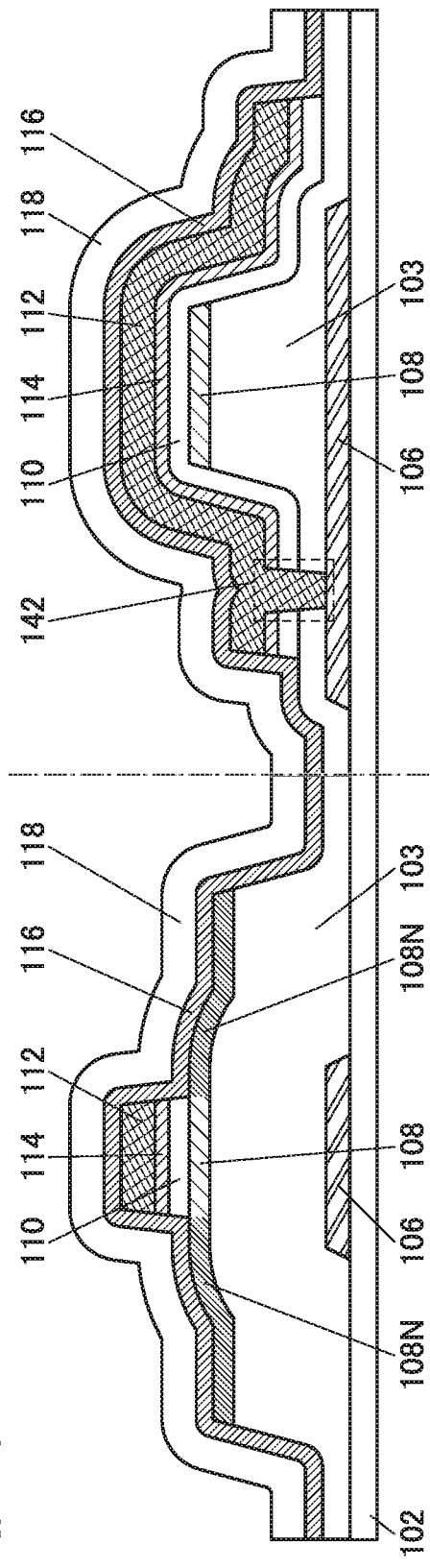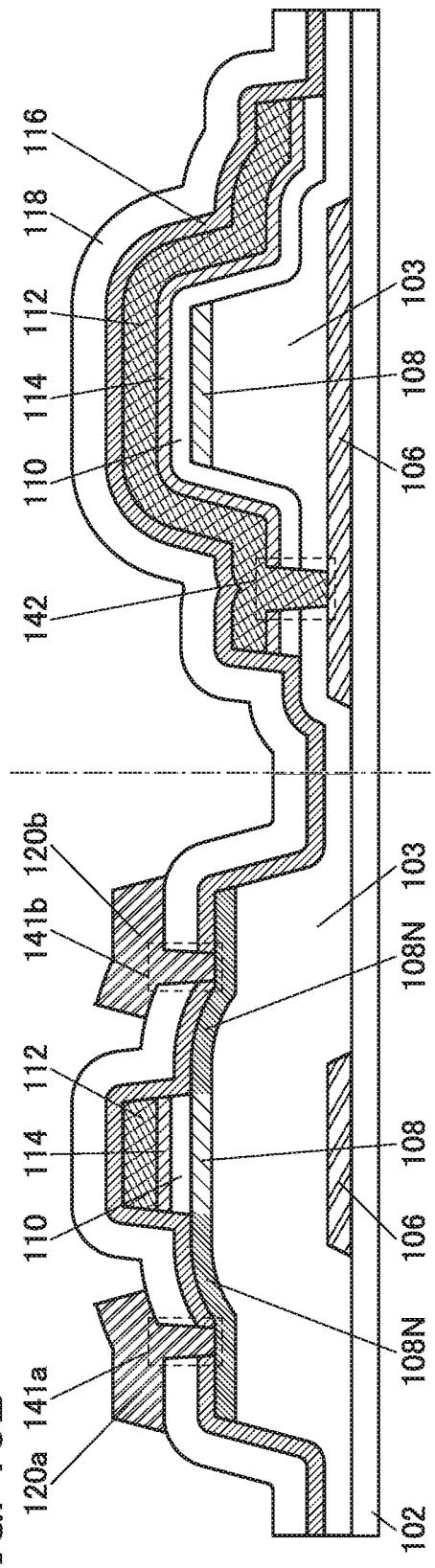

SEMICONDUCTOR DEVICE AND MANUFACTURING METHOD OF SEMICONDUCTOR DEVICE

TECHNICAL FIELD

One embodiment of the present invention relates to a semiconductor device. Another embodiment of the present invention relates to a display device. Another embodiment of the present invention relates to a method for manufacturing a semiconductor device or a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that makes field-effect mobility (simply referred to as mobility or µFE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; therefore, a high-performance display device provided with driver circuits can be obtained.

Patent Document 2 discloses a thin film transistor in which an oxide semiconductor film including a low-resistance region containing at least one kind in a group consisting of aluminum, boron, gallium, indium, titanium, silicon, germanium, tin, and lead as a dopant is used for a source region and a drain region.

REFERENCE

Patent Document

[Patent Document 1] Japanese Published Patent Application No. 2014-7399
[Patent Document 2] Japanese Published Patent Application No. 2011-228622

SUMMARY OF THE INVENTION

Problems to be Solved by the Invention

One object of one embodiment of the present invention is to provide a semiconductor device that has favorable electrical characteristics. In particular, another object is to provide a semiconductor device in which a large amount of current can flow. Another object is to provide a semiconductor device having stable electrical characteristics. Another object is to provide a highly reliable semiconductor device. Another object is to provide a highly reliable display device.

Note that the descriptions of these objects do not disturb the existence of other objects. One embodiment of the present invention does not have to achieve all the objects. Note that objects other than these can be derived from the description of the specification, the drawings, the claims, and the like.

Means for Solving the Problems

One embodiment of the present invention is a semiconductor device including a semiconductor layer, a first insulating layer, a second insulating layer, a third insulating layer, and a first conductive layer. The semiconductor layer is provided over the first insulating layer. A part of the first insulating layer that overlaps with the semiconductor layer protrudes in the thickness direction, and the first insulating layer includes a first region that overlaps with the semiconductor layer and a second region that does not overlap with the semiconductor layer and is thinner than the first region. The second insulating layer is provided to cover a top surface of the second region, a side surface of the first region, and a top surface and a side surface of the semiconductor layer. The first conductive layer is provided over the second insulating layer, and a bottom surface of the first conductive layer over the second region includes a portion positioned below a bottom surface of the semiconductor layer. The semiconductor layer includes a third region overlapping with the second insulating layer and the first conductive layer and a fourth region not overlapping with the first conductive layer or the second insulating layer. The third insulating layer is provided in contact with the fourth region of the semiconductor layer. The semiconductor layer contains a metal oxide, and the third insulating layer contains a nitride.

In the above, in the first insulating layer, the thickness of the first region is preferably 1.2 times to 10 times the thickness of the second region.

In the above, in the first insulating layer, a gradient of the side surface of the first region is preferably continuously changed from a portion in contact with a bottom end of the semiconductor layer to the second region.

In the above, the first conductive layer preferably includes a portion whose top surface is positioned below a bottom surface of the semiconductor layer.

In the above, the semiconductor layer preferably has a stacked-layer structure in which a first metal oxide film and a second metal oxide film are stacked in this order. At this time, the second metal oxide film preferably has higher crystallinity than the first metal oxide film.

In the above, the semiconductor layer preferably includes a first metal oxide film and a second metal oxide film. At this time, the first metal oxide film is preferably positioned over the first region, and the second metal oxide film is preferably provided in contact with the side surface of the first region and a side surface and a top surface of the first metal oxide film. Furthermore, the second metal oxide film preferably has higher crystallinity than the first metal oxide film.

In the above, the third insulating layer preferably contains nitrogen and one or more elements selected from aluminum, titanium, tantalum, tungsten, chromium, and ruthenium. At this time, the fourth region of the semiconductor layer preferably contains indium in a metal state.

In the above, the third insulating layer preferably contains silicon, nitrogen, and hydrogen.

In the above, a length in the channel length direction of a region of the first conductive layer that overlaps with the semiconductor layer is preferably greater than or equal to 2 μm and less than or equal to 3 μm.

In the above, a length in the channel width direction of a region of the semiconductor layer that is covered with the first conductive layer is preferably greater than or equal to 1 μm and less than or equal to 100 μm.

Another embodiment of the present invention is a method for manufacturing a semiconductor device including a first step of forming a first insulating layer containing an oxide; a second step of depositing a metal oxide film over the first insulating layer; a third step of forming a resist mask over the metal oxide film and etching part of the metal oxide film that is not covered with the resist mask so that a semiconductor layer is formed and part of the first insulating layer is exposed; a fourth step of etching part of the first insulating layer that is not covered with the resist mask to make the part thin so that a first region overlapping with the semiconductor layer and a second region not overlapping with the semiconductor layer are formed; a fifth step of removing the resist mask; a sixth step of forming a second insulating layer covering the semiconductor layer, a side surface of the first region, and a top surface of the second region, and over the second insulating layer, a first conductive layer whose bottom surface is positioned below a bottom surface of the semiconductor layer; and a seventh step of forming a first layer containing a nitride in contact with a portion of the semiconductor layer that is not covered with the first conductive layer and then performing heat treatment.

In the above, the first layer is preferably formed to contain one or more elements selected from aluminum, titanium, tantalum, tungsten, chromium, and ruthenium.

In the above, the first layer is preferably formed to contain silicon, nitrogen, and hydrogen.

Effect of the Invention

According to one embodiment of the present invention, a semiconductor device having favorable electrical characteristics can be provided. Alternatively, a semiconductor device in which a large amount of current can flow can be provided. Alternatively, a semiconductor device having stable electrical characteristics can be provided. Alternatively, a highly reliable semiconductor device can be provided. Alternatively, a highly reliable display device can be provided.

Note that the descriptions of the effects do not disturb the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIGS. 4 (A) and (B) A structure example of a semiconductor device.

FIGS. 6 (A) and (B) Diagrams illustrating a method for manufacturing a semiconductor device.

FIGS. 7 (A) and (B) Diagrams illustrating a method for manufacturing a semiconductor device.

FIGS. 8 (A) and (B) Diagrams illustrating a method for manufacturing a semiconductor device.

FIGS. 9 (A) and (B) Diagrams illustrating a method for manufacturing a semiconductor device.

FIGS. 10 (A) and (B) Diagrams illustrating a method for manufacturing a semiconductor device.

MODE FOR CARRYING OUT THE INVENTION

Figure 1A:
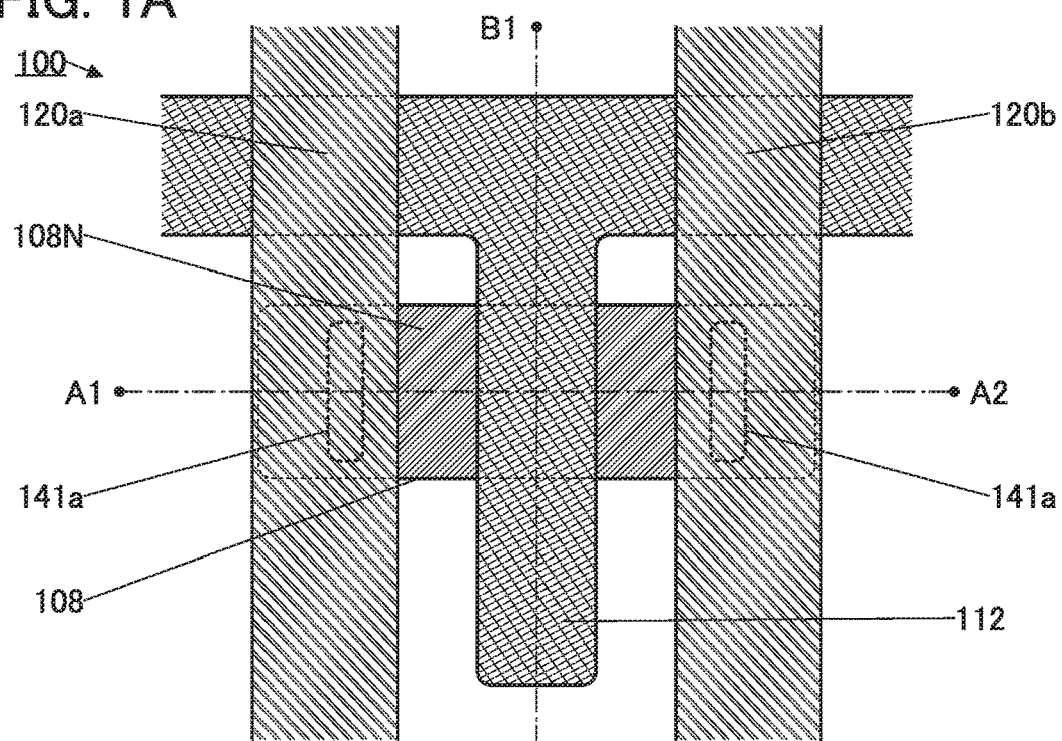
FIGS. 1 (A), (B), and (C) A structure example of a semiconductor device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Therefore, the present invention should not be construed as being limited to the description of embodiments below.

In addition, in each drawing described in this specification, the size, the layer thickness, or the region of each component is exaggerated for clarity in some cases.

Furthermore, ordinal numbers such as "first," "second," and "third" used in this specification are used in order to avoid confusion among components and do not limit the components numerically.

In this specification, terms for describing arrangement, such as "over" and "under", are used for convenience in describing a positional relationship between components with reference to drawings. The positional relation between components is changed as appropriate in accordance with a direction in which the components are described. Thus, terms for the description are not limited to terms used in the specification, and description can be made appropriately depending on the situation.

Furthermore, in this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

Note that in this specification and the like, a channel length direction of a transistor refers to one of the directions parallel to a straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements having a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, an off-state current in this specification and the like refers to a drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

In this specification and the like, a display panel of one embodiment of a display device has a function of displaying (outputting) an image or the like on (to) a display surface. Therefore, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel of one embodiment of the display device has a function of displaying an image or the like on a display surface and a function of a touch sensor capable of detecting the contact, press, approach, or the like of a sensing target such as a finger or a stylus with or to the display surface. Therefore, the touch panel is one embodiment of an input/output device.

A touch panel can be referred to as, for example, a display panel (or a display device) with a touch sensor or a display panel (or a display device) having a touch sensor function. A touch panel can have a structure including a display panel and a touch sensor panel. Alternatively, a touch panel can have a structure having a function of a touch sensor inside or on a surface of a display panel.

In addition, in this specification and the like, a substrate of a touch panel on which a connector and an IC are mounted is referred to as a touch panel module, a display module, or simply a touch panel or the like in some cases.

Embodiment 1

In this embodiment, a semiconductor device and a display device of one embodiment of the present invention and a manufacturing method thereof are described.

One embodiment of the present invention is a transistor including, over a first insulating layer, a semiconductor layer in which a channel is formed, a gate insulating layer over the semiconductor layer, and a conductive layer (also referred to as a first conductive layer) functioning as a gate electrode over the gate insulating layer. The semiconductor layer preferably contains a metal oxide exhibiting semiconductor characteristics (hereinafter also referred to as an oxide semiconductor).

The first insulating layer includes a first region overlapping with the semiconductor layer and a second region other than the first region. In the first insulating layer, the first region has a larger thickness than the second region. In other words, the first region has a projecting portion that protrudes beyond the second region in the thickness direction. In this case, the semiconductor layer is provided over the projecting portion of the first region in the first insulating layer.

In addition, the side surface of the first region (i.e., the outer edge of the projecting portion) in the first insulating layer preferably has a tapered shape. At this time, an angle formed between the side surface of the first region and the top surface of the second region is greater than 90° and less than 180°, preferably greater than or equal to 100° and less than or equal to 170°, further preferably greater than or equal to 110° and less than or equal to 160°. Accordingly, the coverage with the gate insulating layer covering the side surface of the first region can be improved, which can inhibit the reduction of the thickness of the portion.

Furthermore, a gradient of the side surface of the first region in the first insulating layer is preferably continuously changed from a portion in contact with a bottom end of the semiconductor layer to the second region. Accordingly, the coverage with the gate insulating layer covering the semiconductor layer and the first insulating layer, the gate electrode, a first layer, which is described later, and the like can be further improved.

Furthermore, the gate insulating layer and the gate electrode are provided to cover the top surface and the side surface of the semiconductor layer, and the side surface of the first region and the top surface of the second region in the first insulating layer in the channel width direction of the transistor. At this time, the bottom surface of the gate electrode in a portion overlapping with the second region is preferably positioned below the bottom surface of the semiconductor layer over the first region. Accordingly, an electric field generated when voltage is applied to the gate electrode can affect the semiconductor layer not only from the top surface side of the semiconductor layer but also from the side surface side of the semiconductor layer and diagonally below the semiconductor layer, and the electric field can surround the semiconductor layer electrically. Accordingly, an electric field for inducing a channel can be more effectively applied to the semiconductor layer, so that the field-effect mobility of the transistor can be improved, and thus the on-state current can be increased.

The difference in thickness between the first region and the second region in the first insulating layer can be controlled in consideration of the thickness of the gate insulating layer or the like. The difference in thickness between the first region and the second region is larger than at least the thickness of the gate insulating layer. In the case where a layer other than the gate insulating layer is provided between the semiconductor layer and the gate electrode, the second region is preferably processed to be thin in consideration of the thickness of the layer.

For example, the thickness of the first region can be 1.2 times or more, preferably 1.5 times or more, further preferably two times or more, still further preferably 2.5 times or more and 10 times or less the thickness of the second region.

Alternatively, the first insulating layer is preferably processed such that the difference between the thickness of the first region and the thickness of the second region is one time or more, preferably 1.2 times or more, further preferably 1.5 times or more, still further preferably two times or more and 20 times or less the thickness of the gate insulating layer.

An example of a method for forming the first insulating layer is described. First, a metal oxide film to be the semiconductor layer is formed over an insulating film to be the first insulating layer, a resist mask is formed over the metal oxide film, and part of the metal oxide film that is not covered with the resist mask is etched to form the semiconductor layer. Then, in the insulating film to be the first insulating layer, a portion that is not covered with the resist mask is thinned by etching, whereby the first region overlapping with the semiconductor layer and the second region that is thinner than the first region can be formed. At this time, it is important that etching is performed such that the second region is not eliminated.

Note that the first insulating layer may have a stacked-layer structure having two or more insulating films, in which the second region has a structure in which one or more of the insulating films positioned at the top of the first insulating layer is removed.

Here, a wet etching method is preferably used for etching of the metal oxide film, and an anisotropic dry etching method is preferably used for etching of the insulating film to be the first insulating layer. Alternatively, the metal oxide film and the insulating film to be the first insulating layer may be successively etched by a thy etching method.

A region of the semiconductor layer that is covered with the gate electrode functions as a channel formation region. Meanwhile, regions that are not covered with the gate electrode preferably function as a source region and a drain region and preferably have lower resistance than the channel formation region (hereinafter also referred to as low-resistance regions). Thus, it is preferable that the first layer (also referred to as a third insulating layer) that can reduce the resistance of the semiconductor layer be provided in contact with a portion of the semiconductor layer that is not covered with the gate electrode.

For example, the low-resistance regions of the semiconductor layer are preferably regions whose resistance is lowered by performing heat treatment in the state where the first layer is formed to cover the low-resistance regions.

For the first layer, a film containing at least one of metal elements such as aluminum, titanium, tantalum, tungsten, chromium, and ruthenium can be used. It is particularly preferable that at least one of aluminum, titanium, tantalum, and tungsten be contained. Alternatively, it is preferable to use a nitride containing at least one of these metal elements or an oxide containing at least one of these metal elements.

For example, a nitride film such as an aluminum nitride film, an aluminum titanium nitride film, or a titanium nitride film or an oxide film such as an aluminum titanium oxide film can be preferably used. Alternatively, a metal film such as a tungsten film or a titanium film may be used.

For example, in the case of using an aluminum titanium nitride film, the film preferably satisfies a composition formula of $AlTiN_x$ ($x$ is a real number larger than 0 and smaller than or equal to 3) or a composition formula of $AlTi_xN_y$ ($x$ is a real number larger than 0 and smaller than or equal to 2 and $y$ is a real number larger than 0 and smaller than or equal to 4).

The temperature of the heat treatment is preferably high because the treatment with a higher temperature can further accelerate the reduction in resistance of the low-resistance regions. The temperature of the heat treatment is determined in consideration of the heat resistance of the gate electrode, for example. The temperature can be set higher than or equal to 150° C. and lower than or equal to 500° C., preferably higher than or equal to 200° C. and lower than or equal to 450° C., further preferably higher than or equal to 250° C. and lower than or equal to 450° C., still further preferably higher than or equal to 300° C. and lower than or equal to 400° C., for example. When the temperature of the heat treatment is approximately 350° C., for example, the semiconductor device can be manufactured at a high yield with production facilities using a large-sized glass substrate.

The heat treatment is performed while the first layer is provided in contact with part of the semiconductor layer, whereby oxygen in the semiconductor layer is absorbed into the first layer, and thus, a large number of oxygen vacancies can be generated in the semiconductor layer. Accordingly, the low-resistance regions can have an extremely low resistance.

The low-resistance regions formed in the above manner have a feature in that its resistance is not likely to be increased by subsequent process. There is no possibility that the conductivity of the low-resistance regions is impaired by heat treatment in an atmosphere containing oxygen or by deposition process in an atmosphere containing oxygen, for example; thus, a transistor with favorable electrical characteristics and high reliability can be achieved.

In the case where the first layer that has undergone the heat treatment has conductivity, the first layer is preferably removed after the heat treatment. In contrast, when the first layer has insulating properties, the first layer can function as a protective insulating film (third insulating layer) when remaining.

In particular, it is preferable to make the aluminum nitride or aluminum titanium nitride film remain because the film has excellent insulating properties.

Alternatively, the low-resistance regions may contain a larger amount of hydrogen than the channel formation region. Thus, the low-resistance regions can be formed to have lower resistance than the channel formation region. Accordingly, the channel formation region has extremely low carrier density and the source and drain regions have extremely low resistance, which enables the transistor to have excellent electrical characteristics.

As a method for supplying hydrogen to the low-resistance regions, for example, it is preferable to provide, as the first layer, a film containing hydrogen third insulating layer) in contact with part of the semiconductor layer and perform heat treatment in that state. Thus, the hydrogen concentration of the low-resistance regions can be higher than that of the channel formation region.

It is particularly preferable to use an insulating film containing silicon, hydrogen, and nitrogen as the first layer, for example. More specifically, it is preferable to use a silicon nitride film containing hydrogen (also referred to as SiN:H) that is deposited by a plasma CVD method.

Note that the method for supplying hydrogen to the low-resistance regions is not limited to the above method; for example, hydrogen may be supplied to the semiconductor layer by a method such as an ion doping method, an ion implantation method, or heat treatment in an atmosphere containing hydrogen, using the gate electrode as a mask.

Here, the first insulating layer is preferably a film from which oxygen can be released by heating. At this time, oxygen can be supplied from the first region positioned below the semiconductor layer to the channel formation region of the semiconductor layer by heating.

Moreover, it is preferable that the first layer (third insulating layer) be provided to cover not only the low-resistance regions of the semiconductor layer but also the side surfaces of the first region in the first insulating layer that are positioned on the outside of the low-resistance regions of the semiconductor layer in the channel length direction of the transistor. Since the above-described first layer has a property of not easily transmitting oxygen, outward diffusion of oxygen contained in the first region from its side surface can be prevented. Accordingly, a large amount of oxygen can be supplied to the channel formation region of the semiconductor layer, so that the carrier density in the channel formation region is reduced and a highly reliable transistor can be obtained.

The transistor of one embodiment of the present invention having such a structure is a transistor having favorable electrical characteristics and high reliability.

More specific examples are described below with reference to drawings.

Structure Example 1

Figure 1B:
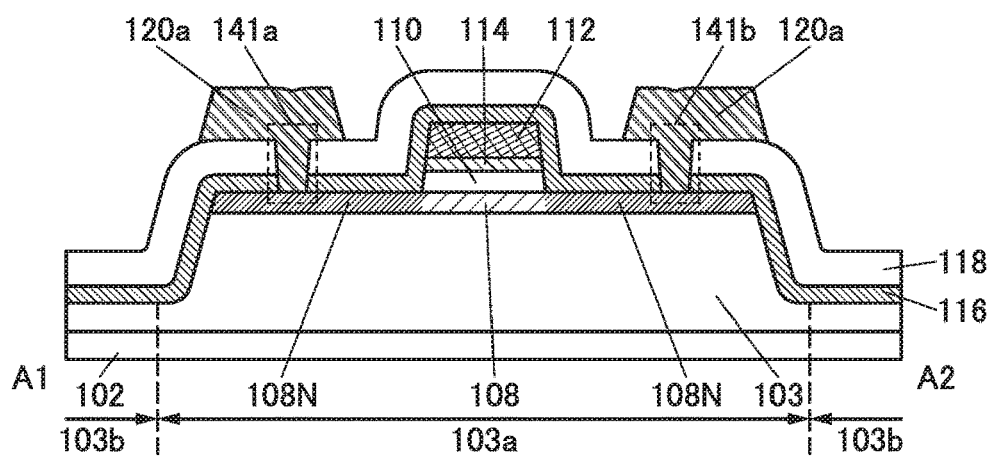
Figure 1C:
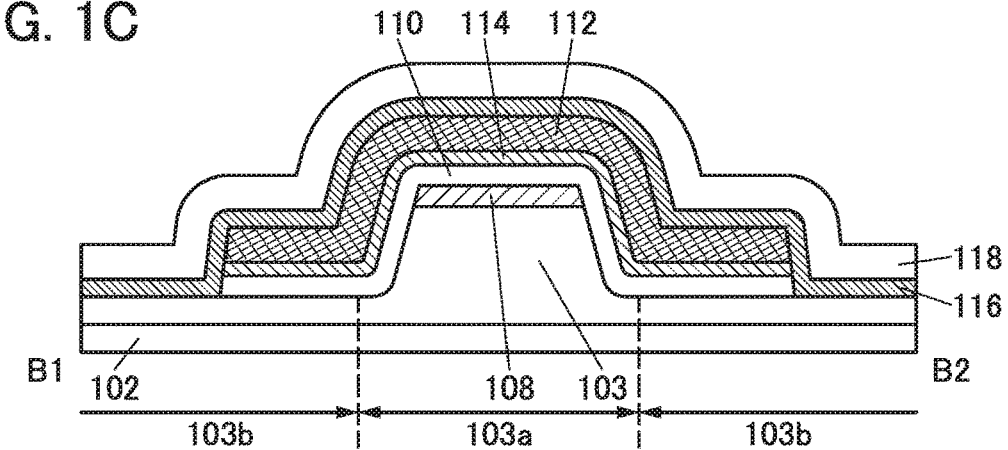

FIG. 1(A) is a top view of a transistor 100, FIG. 1(B) corresponds to a cross-sectional view of a cut plane along the dashed-dotted line A1-A2 in FIG. 1(A), and FIG. 1(C) corresponds to a cross-sectional view of a cut plane along the dashed-dotted line B1-B2 in FIG. 1(A). Note that in FIG. 1(A), some components (e.g., an insulating layer) of the transistor 100 are not illustrated. In addition, the direction of the dashed-dotted line A1-A2 corresponds to a channel length direction, and the direction of the dashed-dotted line B1-B2 corresponds to a channel width direction. Furthermore, some components are not illustrated in top views of transistors in the following drawings, as in FIG. 1(A).

The transistor 100 is provided over a substrate 102 and includes an insulating layer 103, a semiconductor layer 108, an insulating layer 110, a metal oxide layer 114, a conductive layer 112, an insulating layer 116, an insulating layer 118, and the like. The island-shaped semiconductor layer 108 is provided over the insulating layer 103. The insulating layer 110, the metal oxide layer 114, and the conductive layer 112 are stacked in this order to cover part of the semiconductor layer 108 and part of the insulating layer 103. The insulating layer 110, the metal oxide layer 114, and the conductive layer 112 are provided so that their top surface shapes are substantially aligned in a plan view. The insulating layer 116 is provided to cover a top surface and a side surface of the conductive layer 112, a side surface of the metal oxide layer 114, a top surface and a side surface of the insulating layer 110, a top surface and a side surface of the semiconductor layer 108, and a surface of the insulating layer 103. The insulating layer 118 is provided to cover the insulating layer 116.

Note that in this specification and the like, the expression "having substantially the same top surface shapes" means that at least outlines of stacked layers partly overlap with each other. For example, the case of processing or partly processing an upper layer and a lower layer with the use of the same mask pattern is included. However, in some cases, the outlines do not completely overlap with each other and the upper layer is positioned on an inner side of the lower layer or the upper layer is positioned on an outer side of the lower layer; such a case is also represented by the expression "having substantially the same top surface shapes."

Part of the conductive layer 112 functions as a gate electrode. Part of the insulating layer 110 functions as a gate insulating layer. A portion of the semiconductor layer 108 overlapping with the conductive layer 112 functions as a channel formation region. The transistor 100 is what is called a top-gate transistor, in which the gate electrode is provided over the semiconductor layer 108.

In addition, as illustrated in FIGS. 1(A) and 1(B), the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to regions 108N, which are described later, through an opening portion 141a and an opening portion 141b, respectively, which are provided in the insulating layer 118 and the insulating layer 116.

The semiconductor layer 108 preferably contains a metal oxide.

The semiconductor layer 108 preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or a plurality of kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

The metal oxide layer 114 positioned between the insulating layer 110 and the conductive layer 112 functions as a barrier film that prevents diffusion of oxygen contained in the insulating layer 110 into the conductive layer 112 side. Furthermore, the metal oxide layer 114 also functions as a barrier film that prevents diffusion of hydrogen and water contained in the conductive layer 112 into the insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 to the semiconductor layer 108 through the insulating layer 110 can be prevented. Consequently, carrier density in the channel formation region of the semiconductor layer 108 can be extremely low.

For the metal oxide layer 114, an insulating material or a conductive material can be used. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode.

The metal oxide layer 114 is preferably formed using an insulating material with a higher permittivity than that of silicon oxide. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 114, an oxide material containing one or more elements that are the same as those of the semiconductor layer 108 is preferably used. It is particularly preferable to use an oxide semiconductor material that can be used for the semiconductor layer 108. Here, a metal oxide film formed using the same sputtering target as that for the semiconductor layer 108 is preferably applied to the metal oxide layer 114 because an apparatus can be shared.

Alternatively, when a metal oxide material containing indium and gallium is used for both the semiconductor layer 108 and the metal oxide layer 114, a material whose composition (content ratio) of gallium is higher than that of the material used for the semiconductor layer 108 is preferably used for the metal oxide layer 114 because an oxygen blocking property can be further increased. Here, when the semiconductor layer 108 is formed using a material whose composition of indium is higher than that of the material used in the metal oxide layer 114, the field-effect mobility of the transistor 100 can be increased.

In addition, the metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

The semiconductor layer 108 has a channel formation region overlapping with the conductive layer 112 with the insulating layer 110 interposed therebetween. The semiconductor layer 108 includes a pair of regions 108N between which the channel formation region is sandwiched. The regions 108N have lower resistance than the channel formation region and function as a source region and a drain region of the transistor 100.

The insulating layer 103 includes a region 103a overlapping with the semiconductor layer 108 and a region 103b not overlapping with the semiconductor layer 108. The insulating layer 103 has a shape in which the region 103a protrudes beyond the region 103b in the thickness direction. The region 103a can be referred to as a projecting portion.

In the insulating layer 103, the region 103a is thicker than the region 103b. The side surface of the region 103a (the outer edge of the projecting portion of the insulating layer 103) is preferably tapered from the portion in contact with the bottom end of the semiconductor layer 108 to the region 103b. In that case, an angle formed between the side surface of the region 103a and the top surface of the region 103b is preferably an obtuse angle. More specifically, the angle formed between the side surface of the region 103a and the top surface of the region 103b is preferably greater than 90° and less than 180°, further preferably greater than or equal to 100° and less than or equal to 170°, still further preferably greater than or equal to 110° and less than or equal to 160°. Accordingly, coverage with the films positioned above the insulating layer 103 (e.g., the insulating layer 110, the metal oxide layer 114, the conductive layer 112, and the insulating layer 116) is improved; thus, the reliability of the transistor 100 can be increased because a low-density region (also referred to as a void) is unlikely to be formed.

Furthermore, a gradient of the side surface of the region 103a is preferably continuously changed from its top end (the vicinity of the portion in contact with the bottom end of the semiconductor layer 108) to the top surface of the region 103b. When the side surface of the region 103a is gently curved and the side surface of the region 103a and the top surface of the region 103b are continuously connected as described above, the coverage with the films positioned above the insulating layer 103 can be further increased.

As illustrated in FIG. 1(C), in the channel width direction, the insulating layer 110, the metal oxide layer 114, and the conductive layer 112 are provided to cover the top surface and the side surface of the semiconductor layer 108 and the side surface of the region 103a and the top surface of the region 103b of the insulating layer 103.

Figure 2A:
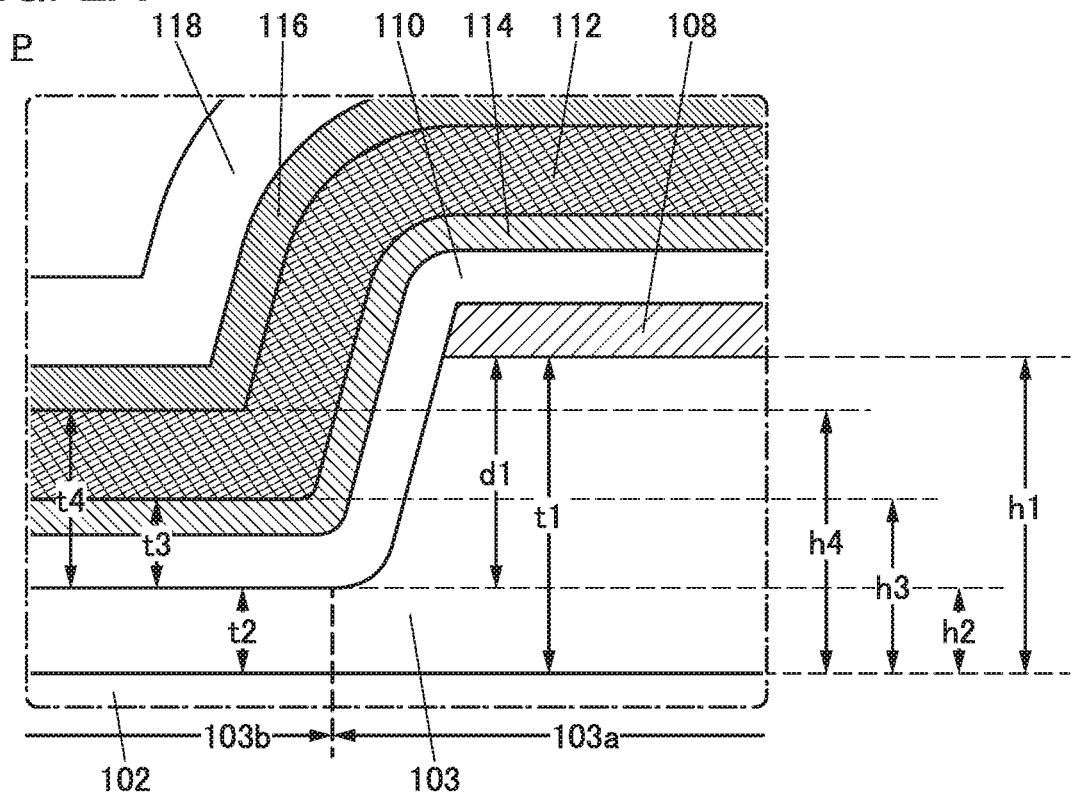
FIGS. 2 (A) and (B) Structure examples of a semiconductor device.

FIG. 2(A) is an enlarged view of part of FIG. 1(C). FIG. 2(A) illustrates thicknesses t1 to t4 and heights h1 to h4.

The thickness t1 is the thickness of the region 103a and the thickness t2 is the thickness of the region 103b. The thickness t3 is the total thickness of the insulating layer 110 and the metal oxide layer 114 in a portion overlapping with the region 103b. The thickness t4 is the total thickness of the insulating layer 110, the metal oxide layer 114, and the conductive layer 112 in a portion overlapping with the region 103b.

Here, when the difference between the thickness of the region 103a and the thickness of the region 103b is referred to as a difference d1, "d1=t1−t2" is satisfied. At this time, as illustrated in FIG. 2(A), the difference d1 is preferably larger than the thickness t3, The difference d1 is preferably larger than the thickness t4.

Meanwhile, for each of the heights h1 to h4, the bottom surface of the region 103a of the insulating layer 103 is used as a reference. The height h1 is a height of the bottom surface of the semiconductor layer 108 (the interface between the insulating layer 103 and the semiconductor layer 108 in the case where they are in contact with each other). The height h2 is a height of the top surface of the region 103b (the interface between the insulating layer 103 and the insulating layer 110 in the case where they are in contact with each other). The height h3 is a height of the bottom surface of a portion of the conductive layer 112 that overlaps with the region 103b (the interface between the conductive layer 112 and the metal oxide layer 114 in the case where they are in contact with each other). The height h4 is a height of the top surface of a portion of the conductive layer 112 that overlaps with the region 103b (the interface between the conductive layer 112 and the insulating layer 116 in the case where they are in contact with each other).

At this time, as illustrated in FIG. 2(A), the height h1 of the bottom surface of the semiconductor layer 108 is preferably higher than the height h3 of the bottom surface of the conductive layer 112. The height h1 is preferably higher than the height h4 of the top surface of the conductive layer 112.

Figure 2B:
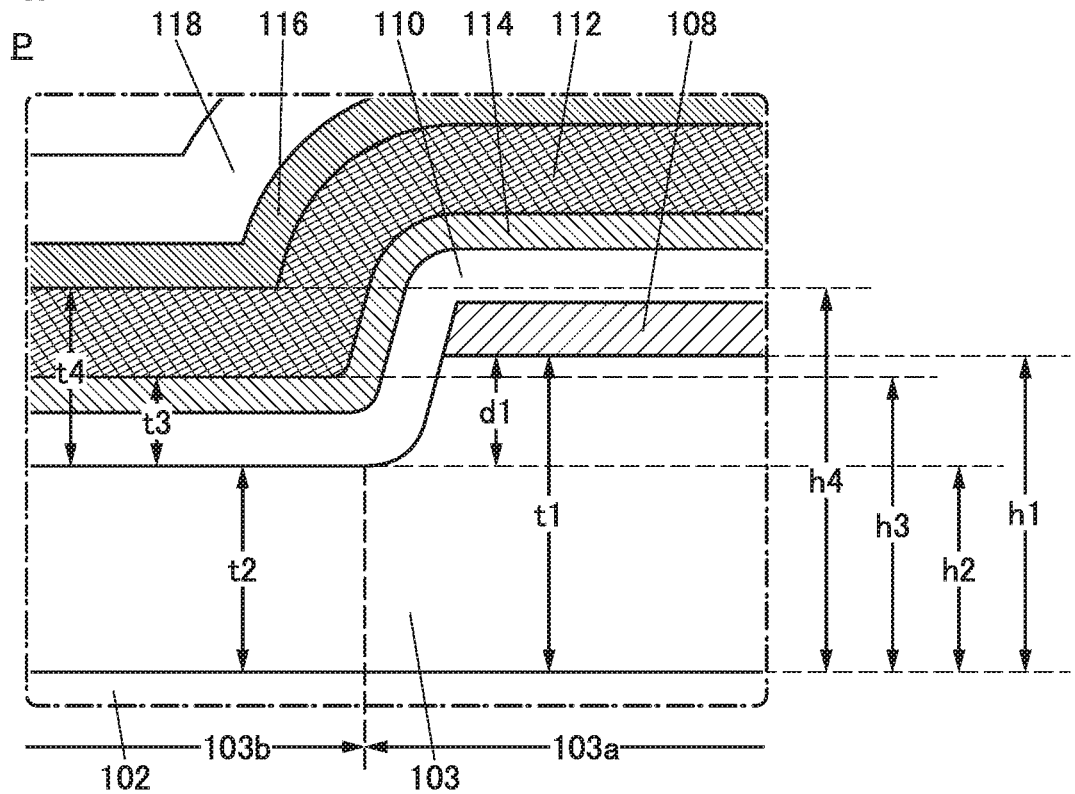

Note that as illustrated in FIG. 2(B), the difference d1 between the thickness of the region 103a and the thickness of the region 103b may be smaller than the thickness t4 of the insulating layer 110, the metal oxide layer 114, and the conductive layer 112 that overlap with the region 103b. Moreover, as illustrated in FIG. 2(B), the height h1 of the bottom surface of the semiconductor layer 108 may be lower than the height h4 of the top surface of the conductive layer 112.

With such a structure, in the channel width direction, the conductive layer 112 can be provided to be positioned not only on the top surface side of the semiconductor layer 108 but also on the side surface side of the semiconductor layer 108 and diagonally below the bottom end of the semiconductor layer 108. With such a structure, the semiconductor layer 108 can be electrically surrounded by electric fields generated when voltage is applied to the conductive layer 112, so that the on-state current of the transistor 100 can be increased.

In general, the on-state current of the transistor can be increased by designing the ratio of the channel width W to the channel length L (W/L ratio) to be high. However, one embodiment of the present invention can increase the field-effect mobility and the on-state current of the transistor, without a change of the design, that is, without an increase of the channel width W.

The channel width W of the transistor may be set depending on characteristic values required when the transistor is included in a circuit; for example, in the case where the transistor is used for a pixel circuit, a driver circuit, or the like of a display device, an extremely large amount of current can flow even when the channel width W is set to greater than or equal to 1 μm and less than or equal to 100 μm, preferably greater than or equal to 1.2 μm and less than or equal to 50 μm, and further preferably greater than or equal to 1.5 μm and less than or equal to 30 μm. Note that the channel width. W is not limited to this and may be set to greater than 100 μm depending on the required characteristics.

Since the transistor 100 can have high field-effect mobility and a high on-state current, the channel length L can be set relatively large, so that variation in characteristics of a transistor and a manufacturing yield of a transistor can be improved. Like the channel width W, the channel length L of the transistor may also be set depending on required characteristic values; for example, in the case where the transistor is used for a pixel circuit, a driver circuit, or the like of a display device, the channel length L is preferably set to greater than or equal to 1 μm and less than or equal to 20 μm, further preferably greater than or equal to 1.2 μm and less than or equal to 15 μm, still further preferably greater than or equal to 1.5 μm and less than or equal to 10 μm. In particular, when the channel length L is greater than or equal to 1.5 μm and less than or equal to 5 μm, preferably greater than or equal to 2 μm and less than or equal to 3 μm, variation in the channel length L in the substrate plane can be inhibited, and thus a manufacturing yield can be high. Note that the channel length L is not limited thereto and may be greater than 20 μm depending on the required characteristics.

Note that in this specification and the like, a channel length direction of a transistor refers to one of the directions parallel to a straight line that connects a source region and a drain region in the shortest distance. In other words, the channel length direction corresponds to one of directions of current flowing in a semiconductor layer when a transistor is in an on state. A channel width direction refers to a direction orthogonal to the channel length direction. Note that each of the channel length direction and the channel width direction is not fixed to one direction in some cases depending on the structure and the shape of a transistor.

Here, the channel length L of the transistor 100 refers to the length of a region of the conductive layer 112 that overlaps with the semiconductor layer 108 in the channel length direction. Furthermore, the channel width of the transistor 100 refers to the length of a region of the semiconductor layer 108 that is covered with the conductive layer 112 in the channel width direction.

As illustrated in FIG. 1(B), the insulating layer 116 is provided in contact with the regions 108N of the semiconductor layer 108. Since the insulating layer 116 is in contact with both the semiconductor layer 108 and the conductive layer 112, the insulating layer 116 preferably has an insulating property.

As the insulating layer 116 that is in contact with the regions 108N, an insulating film containing a nitride can be used. When the insulating layer 116 containing a nitride is provided in contact with the regions 108N, the effect of further increasing the conductivity of the regions 108N is attained. Furthermore, heat treatment is preferably performed in the state where the insulating layer 116 is in contact with the regions 108N because the resistance can be further reduced.

As the nitride that can be used for the insulating layer 116, a nitride of a semiconductor material such as silicon nitride or gallium nitride or a metal nitride such as aluminum nitride is particularly preferably used, for example. For example, because of having a blocking property against hydrogen and oxygen, silicon nitride can prevent both diffusion of hydrogen from the outside into the semiconductor layer and release of oxygen from the semiconductor layer to the outside, and can achieve a highly reliable transistor.

In the case of using a metal nitride, it is preferable to use a nitride of aluminum, titanium, tantalum, tungsten, chromium, or ruthenium. In particular, aluminum or titanium is preferably contained. For example, an aluminum nitride film formed by a reactive sputtering method using aluminum as a sputtering target and a nitrogen-containing gas as a deposition gas can be a film having both an extremely high insulating property and an extremely high blocking property against hydrogen and oxygen when the flow rate of a nitrogen gas to the total flow rate of the deposition gas is appropriately controlled. Thus, when such an insulating film containing a metal nitride is provided in contact with the semiconductor layer, the resistance of the semiconductor layer can be lowered, and release of oxygen from the semiconductor layer and diffusion of hydrogen into the semiconductor layer can be favorably prevented.

In the case where aluminum nitride is used as the metal nitride, the thickness of the insulating layer containing aluminum nitride is preferably 5 nm or more. A film with such a small thickness can have both a high blocking property against hydrogen and oxygen and a function of lowering the resistance of the semiconductor layer. Note that there is no upper limit of the thickness of the insulating layer; however, the thickness is preferably less than or equal to 500 nm, further preferably less than or equal to 200 nm, still further preferably less than or equal to 50 nm in consideration of productivity.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation of heat generated in driving the transistor 100 can be increased.

Alternatively, an aluminum titanium nitride film, a titanium nitride film, or the like can be used as the insulating layer 116.

Such an insulating layer 116 is provided in contact with the regions 108N, whereby the insulating layer 116 absorbs oxygen in the regions 108N and oxygen vacancies can be formed in the regions 108N. In the case where a film containing a metal oxide is used as the insulating layer 116, a layer containing an oxide of a metal element (e.g., aluminum) contained in the insulating layer 116 is formed between the insulating layer 116 and the regions 108N in some cases.

Here, in the case where a metal oxide film containing indium is used as the semiconductor layer 108, a region where indium in a metal state is precipitated or a region having a high indium concentration is sometimes formed in the vicinity of the region 108N with the insulating layer 116. Such regions can be observed by an analysis method such as an X-ray photoelectron spectroscopy (XPS) in some cases, for example.

As described above, the regions 108N can include a larger number of oxygen vacancies than the channel formation region and thus can have lower resistance than the channel formation region. Furthermore, with the use of an insulating film containing a metal oxide as the insulating layer 116, a high-conductivity region where indium is precipitated is formed in the region 108N at the vicinity of the interface with the insulating layer 116, and the region 108N can have a further lower resistance.

Alternatively, as the insulating layer 116, a film functioning as a supply source of hydrogen to the regions 108N can be used. For example, the insulating layer 116 is preferably a film from which hydrogen is released by heating. When such an insulating layer 116 is formed in contact with the regions 108N and then heat treatment is performed, hydrogen can be supplied to the regions 108N, and thus the resistance of the regions 108N can be reduced.

The insulating layer 116 is preferably a film deposited using a gas containing a hydrogen element as a deposition gas used for the deposition. Thus, hydrogen can be effectively supplied to the regions 108N also at the time of the deposition of the insulating layer 116.

For the insulating layer 116, for example, an insulating film of silicon nitride, silicon nitride oxide, silicon oxynitride, aluminum nitride, or aluminum nitride oxide can be used.

Hydrogen is supplied to the regions 108N in the deposition of the insulating layer 116 and by heat treatment after the deposition of the insulating layer 116. The supplied hydrogen is bonded to oxygen vacancies in the regions 108N and can be a carrier generation source. Accordingly, the regions 108N can have a higher carrier concentration and lower resistance than the channel formation region.

For each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, heat treatment or the like in the manufacturing process of the transistor 100 can supply oxygen released from the insulating layer 103 and the insulating layer 110 to the channel formation region of the semiconductor layer 108 to reduce oxygen vacancies in the semiconductor layer 108.

Here, as illustrated in. FIG. 1(B), the insulating layer 116 is preferably provided to cover the side surface of the region 103a of the insulating layer 103. Oxygen that is contained in the insulating layer 103 and can be released by heating can be supplied from the region 103a of the insulating layer 103 to the semiconductor layer 108. Therefore, in order to prevent oxygen from being released from the side surface of the region 103a by heating, the side surface is covered with the insulating layer 116 to which oxygen is less likely to be diffused. Furthermore, as illustrated in FIG. 1(B), the insulating layer 116 further preferably covers the top surface of the region 103b of the insulating layer 103. Accordingly, oxygen released from the insulating layer 103 can be supplied to the semiconductor layer 108 effectively. Accordingly, the carrier density in the channel formation region of the semiconductor layer 108 can be reduced, and the reliability of the transistor 100 can be improved.

The insulating layer 118 functions as a protective layer protecting the transistor 100. For example, an inorganic insulating material such as an oxide or a nitride can be used for the insulating layer 118. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used. Alternatively, the insulating layer 118 can be used as a planarization layer. In that case, an organic resin material can be used for the insulating layer 118.

Note that although the case where a stacked-layer structure of the insulating layer 116 and the insulating layer 118 is employed as the protective layer is described here, the insulating layer 118 is not necessarily provided when not needed. Moreover, the insulating layer 118 may have a stacked-layer structure of two or more layers.

Here, as for the semiconductor layer 108, oxygen vacancies that might be formed in the semiconductor layer 108 are described.

Oxygen vacancies formed in the channel formation region of the semiconductor layer 108 affect the transistor characteristics and therefore cause a problem. For example, when oxygen vacancies are formed in the semiconductor layer 108, the oxygen vacancies might be bonded with hydrogen to serve as a carrier supply source. The carrier supply source generated in the channel formation region causes a change in the electrical characteristics, typically, a shift in the threshold voltage, of the transistor 100. Therefore, the number of oxygen vacancies in the channel formation region is preferably as small as possible.

In view of this, one embodiment of the present invention has a structure in which insulating films in the vicinity of the channel formation region of the semiconductor layer 108, specifically, the insulating layer 110 positioned above the channel formation region and the insulating layer 103 positioned below the channel formation region each include an oxide film. When oxygen is moved from the insulating layer 103 and the insulating layer 110 to the channel formation region by heat during the manufacturing process or the like, the number of oxygen vacancies in the channel formation region can be reduced.

In addition, the semiconductor layer 108 preferably includes a region where the atomic proportion of In is higher than the atomic proportion of M. A higher atomic proportion of In results in higher field-effect mobility of the transistor.

Here, in the case of a metal oxide film containing In, Ga, and Zn, bonding strength between In and oxygen is weaker than bonding strength between Ga and oxygen; thus, with a higher atomic proportion of In, oxygen vacancies are likely to be generated in the metal oxide film. There is a similar tendency even when a metal element shown above as M is used instead of Ga. The existence of a large number of oxygen vacancies in the metal oxide film leads to a reduction in electrical characteristics and a reduction in reliability of the transistor.

However, in one embodiment of the present invention, an extremely large amount of oxygen can be supplied into the channel formation region of the semiconductor layer 108 containing a metal oxide; thus, a metal oxide material with a high atomic proportion of In can be used. Accordingly, it is possible to achieve a transistor with extremely high field-effect mobility, stable electrical characteristics, and high reliability.

For example, a metal oxide in which the atomic proportion of In is 1.5 times or higher, two times or higher, three times or higher, 3.5 times or higher, or four times or higher the atomic proportion of M can be suitably used.

In particular, the atomic ratio of In to M and Zn in the semiconductor layer 108 is preferably In:M:Zn=4:2:3 or the neighborhood thereof. Alternatively, the atomic ratio of In to M and Zn is preferably In:M:Zn=5:1:6 or in the neighborhood thereof. Furthermore, as the composition of the semiconductor layer 108, the atomic proportions of in, M, and Zn in the semiconductor layer 108 may be approximately equal to each other. That is, a material in which the atomic ratio of In to M and Zn is In:M:Zn=1:1:1 or in the neighborhood thereof may be included.

For example, with the use of the transistor with high field-effect mobility in a gate driver that generates a gate signal, a display device with a small frame width (also referred to as a narrow frame) can be provided. Furthermore, with the use of the transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic proportion of In is higher than the atomic proportion of M, the field-effect mobility might be low if the semiconductor layer 108 has high crystallinity. The crystallinity of the semiconductor layer 108 can be analyzed by using X-ray diffraction (XRD) or a transmission electron microscope (TEM), for example.

Here, by reducing the impurity concentration and reducing the density of defect states (reducing oxygen vacancies) in the channel formation region of the semiconductor layer 108, the carrier density in the film can be reduced. A transistor using such a metal oxide film for the channel formation region of the semiconductor layer rarely has electrical characteristics with a negative threshold voltage (also referred to as normally-on). Furthermore, a transistor using such a metal oxide film can have characteristics of an extremely low off-state current.

When a metal oxide film with high crystallinity is used for the semiconductor layer 108, damage in the processing of the semiconductor layer 108 or in the deposition of the insulating layer 110 can be inhibited, so that a highly reliable transistor can be provided. In contrast, when a metal oxide film with relatively low crystallinity is used for the semiconductor layer 108, the electric conductivity of the transistor can be improved, so that the transistor can have high field-effect mobility.

As the semiconductor layer 108, a metal oxide film having a CAAC (c-axis aligned crystal) structure, a metal oxide film having an nc (nano crystal) structure, or a metal oxide film in which a CAAC structure and an nc structure are mixed is preferably used.

With such a structure, the transistor 100 with excellent electrical characteristics and high reliability can be achieved.

A transistor structure example that is partly different from Structure example 1 shown above is described below. Note that description of the same portions as those in Structure example 1 shown above is omitted below in some cases. Furthermore, in drawings that are referred to later, the same hatching pattern is applied to portions having functions similar to those in the above structure example, and the portions are not denoted by reference numerals in some cases.

Structure Example 2

Figure 3A:
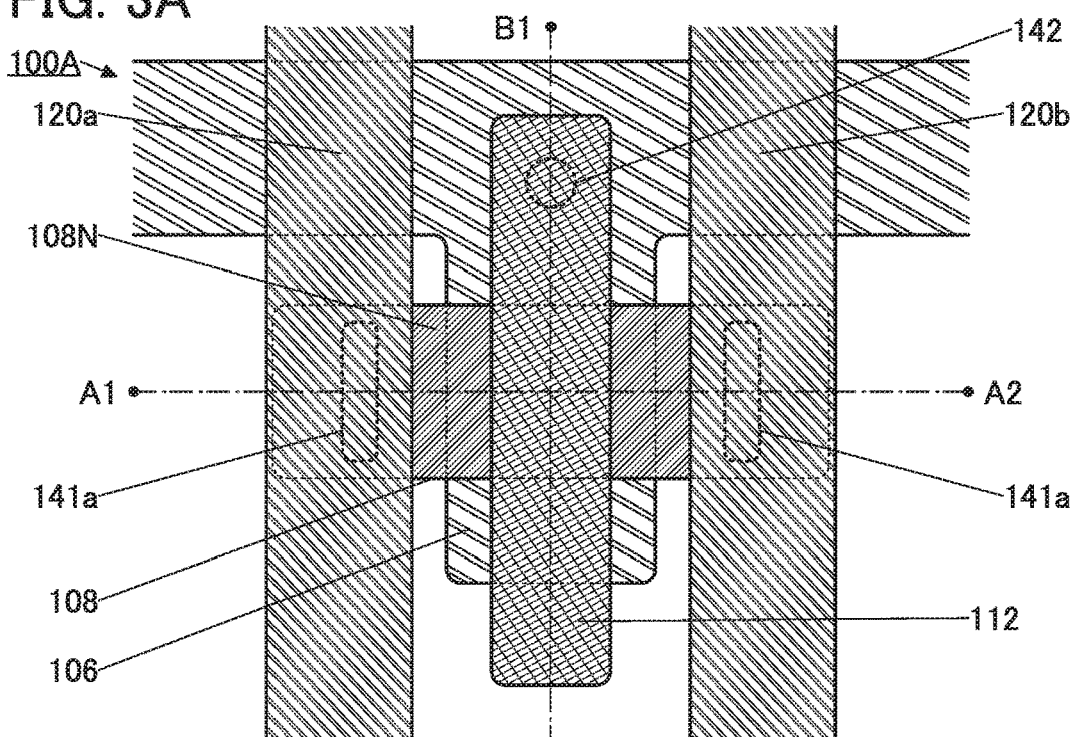
FIGS. 3 (A), (B), and (C) A structure example of a semiconductor device.
Figure 3B:
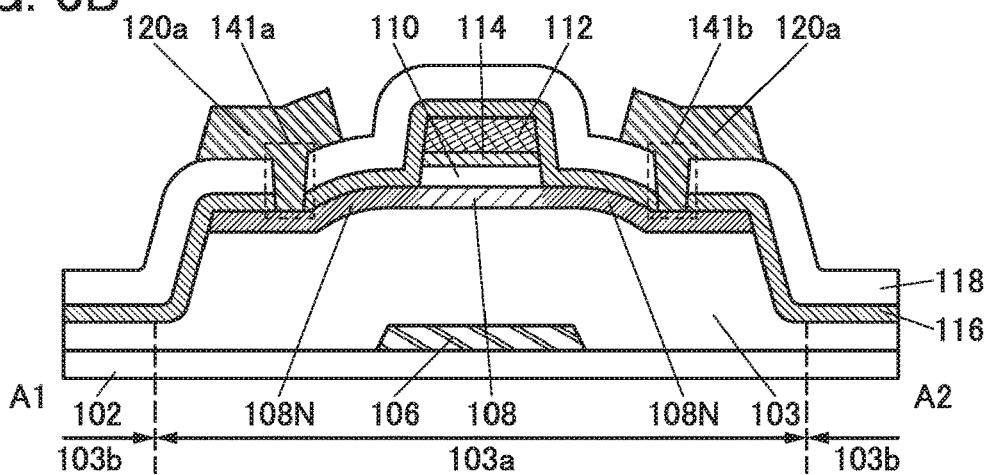
Figure 3C:
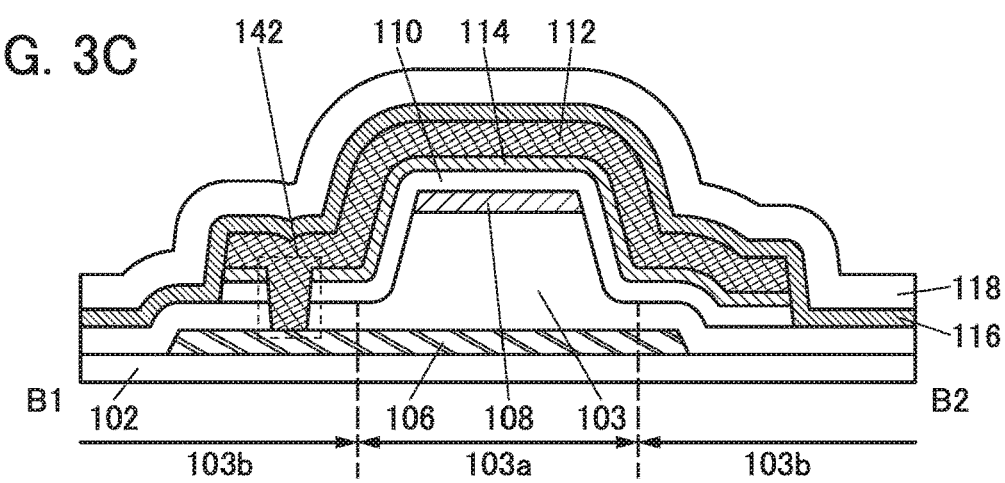

FIG. 3(A) is a top view of a transistor 100A, FIG. 3(B) is a cross-sectional view of the transistor 100A in the channel length direction, and FIG. 3(C) is a cross-sectional view of the transistor 100A in the channel width direction.

The transistor 100A is different from Structure example 1 mainly in including a conductive layer 106 between the substrate 102 and the insulating layer 103. The conductive layer 106 includes a region overlapping with the channel formation region of the semiconductor layer 108 and the conductive layer 112.

In the transistor 100A, the conductive layer 106 functions as a first gate electrode (also referred to as a bottom gate electrode), and the conductive layer 112 functions as a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 is sometimes referred to as a channel formation region in the following description; however, a channel can also be actually formed in a portion not overlapping with the conductive layer 112 and overlapping with the conductive layer 106 (a portion including the regions 108N).

In addition, as illustrated in FIGS. 3(A) and 3(C), the conductive layer 106 may be electrically connected to the conductive layer 112 through an opening 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120a, or the conductive layer 120b can be used. Specifically, a material containing copper is preferably used for the conductive layer 106, in which case wiring resistance can be reduced. When the conductive layer 106 is formed using a material containing a high-melting-point metal such as tungsten or molybdenum, treatment in a later step can be performed at high temperatures.

In addition, as illustrated in FIGS. 3(A) and 3(C), the conductive layer 112 and the conductive layer 106 preferably extend beyond an end portion of the semiconductor layer 108 in the channel width direction. In that case, as illustrated in FIG. 3(C), a structure is employed in which the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be applied to the conductive layer 106 and the conductive layer 112. In that case, electric fields for inducing a channel can be effectively applied to the semiconductor layer 108, whereby the on-state current of the transistor 100A can be increased. Thus, the transistor 100A can also be miniaturized.

Note that a structure in which the conductive layer 112 and the conductive layer 106 are not connected to each other may be employed. In that case, a constant potential may be supplied to one of the pair of gate electrodes, and a signal for driving the transistor 100A may be supplied to the other. In this case, the potential supplied to one of the electrodes can control the threshold voltage at the time of driving the transistor 100A with the other electrode.

The above is the description of Structure example 2.

Structure Example 3

FIG. 4(A) is a cross-sectional view of the transistor 100B in the channel length direction, and FIG. 4(B) is a cross-sectional view of the transistor 100B in the channel width direction. Note that the top view is omitted because FIG. 3(A) can be referred to.

The transistor 100B differs from the transistor 100A exemplified in the above-described Structure example 2 mainly in that instead of the semiconductor layer 108, the semiconductor layer 108a and the semiconductor layer 108b are stacked from the insulating layer 103 side.

For the semiconductor layer 108a and the semiconductor layer 108b, metal oxide films having different compositions can be used, for example. For instance, in the case of using an In—Ga—Zn oxide, films each formed using a sputtering target with an atomic ratio of In:M:Zn=5:1:6, In:M:Zn=4:23, In:M:Zn=1:1:1, In:M:Zn=2:2:1, In:M:Zn=1:3:4, or In:M:Zn=1:3:2 or in the neighborhood thereof are preferably selected to be used.

Furthermore, metal oxide films having different crystallinities may be stacked. In that case, the metal oxide films are preferably successively formed without exposure to the air using the same oxide target under different deposition conditions.

In this case, a stacked-layer structure in which a metal oxide film having an nc structure is used as the semiconductor layer 108a and a metal oxide film having a CAAC structure is used as the semiconductor layer 108b can be employed. Alternatively, a metal oxide film having an nc structure may be used for both the semiconductor layer 108a and the semiconductor layer 108h Note that for a function or a composition of a material of a metal oxide that can be favorably used for the semiconductor layer 108a and the semiconductor layer 108b, a CAC (Cloud-Aligned Composite) to be described later can be referred to.

For example, the oxygen flow rate ratio at the time of forming the earlier-formed first metal oxide film is set smaller than that at the time of forming the subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or depositing the insulating layer 110 can be inhibited.

More specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the deposition such as pressure, temperature, and power may vary between the first metal oxide film and the second metal oxide film, it is preferable to employ the same conditions other than the oxygen flow rate ratio, in which case the time required for the deposition steps can be shortened.

Structure Example 4

Figure 5A:
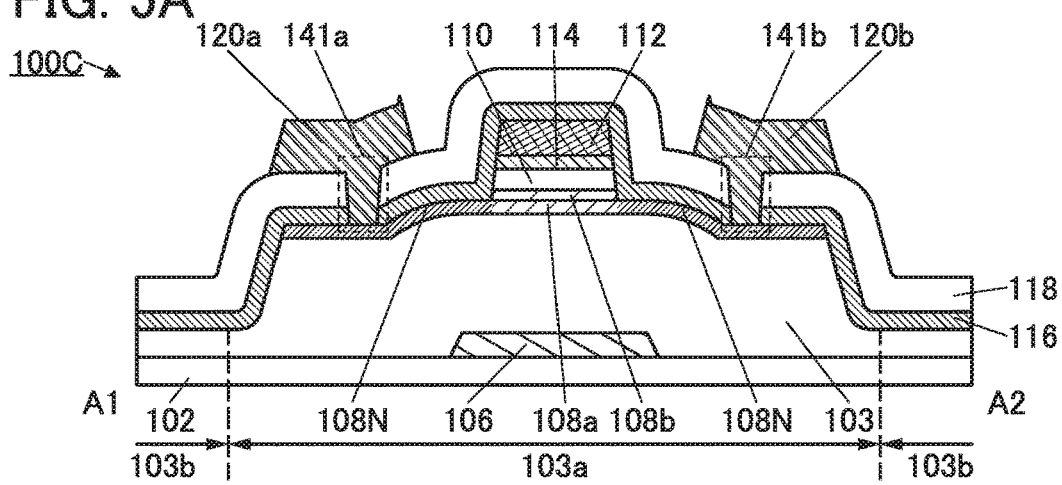
FIGS. 5 (A), (B), and (C) A structure example of a semiconductor device.
Figure 5B:
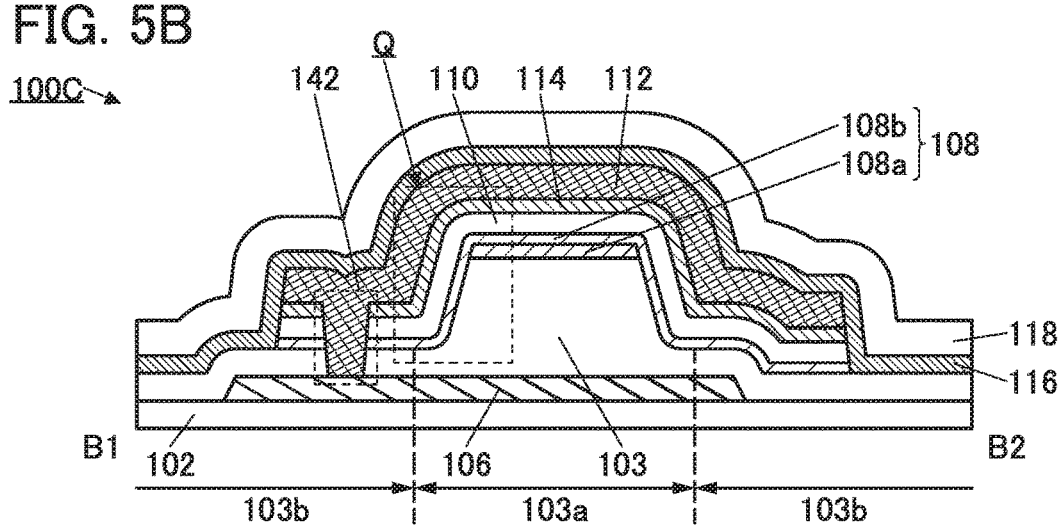

FIG. 5(A) is a cross-sectional view of the transistor 100C in the channel length direction, and FIG. 5(B) is a cross-sectional view of the transistor 100C in the channel width direction. Note that the top view is omitted because FIG. 3(A) can be referred to.

The transistor 100C differs from the transistor 100B exemplified in the above-described Structure example 3 mainly in the shape of the semiconductor layer 108b.

The top surface shape of the semiconductor layer 108b is substantially the same as the top surface shapes of the conductive layer 112, the metal oxide layer 114, and the insulating layer 110. The semiconductor layer 108b can be formed by processing using a resist mask for etching the conductive layer 112 and the like, for example.

The semiconductor layer 108b is provided to cover a top surface and a side surface of the semiconductor layer 108a, and the side surface of the region 103a and part of the top surface of the region 103b of the insulating layer 103.

When a film having higher crystallinity than the semiconductor layer 108a is used as the semiconductor layer 108b, the diffusibility of oxygen in the thickness direction can be reduced. In particular, a metal oxide film having a CAAC structure has characteristics of low oxygen diffusibility in the c-axes directions of crystal parts included in the metal oxide film. Furthermore, the metal oxide film having a CAAC structure can be formed so that the c-axes of the crystal parts included in the metal oxide film are aligned in a direction substantially perpendicular to a surface on which the metal oxide film is formed.

Figure 5C:
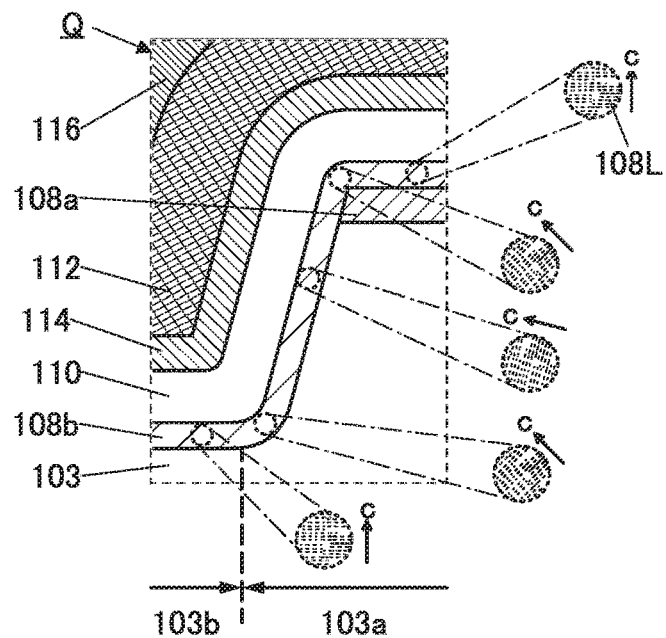

FIG. 5(C) is an enlarged view of a region Q surrounded by a dashed line in FIG. 5(B).

As illustrated in FIG. 5(C), the semiconductor layer 108b having crystallinity is provided to cover the top surface and the side surface of the semiconductor layer 108a, and the side surface of the region 103a and the top surface of the region 103b of the insulating layer 103.

FIG. 5(C) schematically shows the directions of the c-axes of crystals included in the semiconductor layer 108b and the alignment of layers 108L that are included in layered crystal parts indicated by dashed lines in each portion of the semiconductor layer 108b. As described above, in the crystal parts in the semiconductor layer 108b having crystallinity, c-axes i.e., a direction perpendicular to the layers of the layered crystal parts) are aligned in a direction substantially perpendicular to a surface on which the semiconductor layer 108b is formed.

Such a structure in which the semiconductor layer 108b covers the side surface of the region 103b of the insulating layer 103 and the side surface of the semiconductor layer 108a as illustrated in FIG. 5(C) can inhibit diffusion of oxygen that might be released from the insulating layer 103 from the region 103b. In addition, diffusion of oxygen from the side surface of the semiconductor layer 108a to the outside can be prevented. Thus, the number of oxygen vacancies in the semiconductor layer 108*a* can be reduced effectively, leading to a highly reliable transistor.

The above is the description of the structure example.

[Manufacturing Method Example]

A method for manufacturing the semiconductor device of one embodiment of the present invention is described below with reference to drawings. Here, the method is described using the transistor 100A exemplified in the above structure example, as an example.

Note that thin films that form the semiconductor device (insulating films, semiconductor films, conductive films, and the like) can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that form the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are the following two typical ways of a photolithography method. One is a method in which a resist mask is formed over a thin film that is to be processed, and the thin film is processed by etching or the like, so that the resist mask is removed. The other is a method in which, after a photosensitive thin film is formed, exposure and development are performed, so that the thin film is processed into a desired shape.

For light for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

FIG. 6(A) to FIG. 10(B) show cross sections in the channel length direction and the channel width direction, side by side, of the transistor 100A at each stage in the manufacturing process.

<Formation of Conductive Layer 106>

A conductive film is deposited over the substrate 102 and processed by etching to form the conductive layer 106 functioning as a first gate electrode.

<Formation of Insulating Layer 103>

Then, the insulating layer 103 is formed to cover the substrate 102 and the conductive layer 106 (MG. 6(A)). The insulating layer 103 can be formed by a PECVD method, an ALD method, a sputtering method, or the like.

The insulating layer 103 can be deposited to have the thickness of the region 103*a* that is formed later. The thickness of the insulating layer 103 can be set such that the insulating layer 103 is not eliminated in a later step of reducing thickness.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

<Formation of Semiconductor Layer 108=

Next, a metal oxide film 108*f* to be the semiconductor layer 108 later is formed over the insulating layer 103 (RIG. 6(B)).

The metal oxide film is preferably formed by a sputtering method using a metal oxide target.

In forming the metal oxide film, an inert gas (e.g., a helium gas, an argon gas, or a xenon gas) may be mixed in addition to the oxygen gas. Note that when the proportion of an oxygen gas in the whole deposition gas (hereinafter also referred to as an oxygen flow rate ratio) at the time of forming the metal oxide film is higher, the crystallinity of the metal oxide film can be higher and a transistor with higher reliability can be obtained. In contrast, when the oxygen flow rate ratio is lower, the crystallinity of the metal oxide film is lower and a transistor with a high on-state current can be obtained.

In the case where the semiconductor layer 108 has a stacked-layer structure, it is preferable to deposit the layers successively using the same sputtering target in the same deposition chamber because the interface can be favorable. Although the conditions at the time of the deposition such as pressure, temperature, and power may vary between the metal oxide films, it is particularly preferable to employ the same conditions other than the oxygen flow rate ratio, in which case the time required for the deposition steps can be shortened. Furthermore, in the case where metal oxide films having different compositions are stacked, it is preferable that the metal oxide films be successively formed without exposure to the air.

The deposition conditions are preferably set so that the metal oxide film becomes a metal oxide film having a CAAC structure, a metal oxide film having an nc structure, or a metal oxide film in which a CAAC structure and an nc structure are mixed. Note that the deposition conditions in which the deposited metal oxide film has a CAAC structure and the deposition conditions in which the deposited metal oxide film has an nc structure are different depending on the compositions of the sputtering targets to be used; therefore, the substrate temperature, the oxygen flow rate ratio, the pressure, the power, and the like are set as appropriate in accordance with the compositions.

The metal oxide film is deposited at a substrate temperature higher than or equal to room temperature and lower than or equal to 450° C., preferably a substrate temperature higher than or equal to room temperature and lower than or equal to 300° C., further preferably higher than or equal to room temperature and lower than or equal to 200° C., still further preferably higher than or equal to room temperature and lower than or equal to 140° C. For example, in the case where a large-sized glass substrate or a resin substrate is used as the substrate 102, the deposition temperature is preferably higher than or equal to room temperature and lower than 140° C., in which case productivity can be increased. When the metal oxide film is deposited with the substrate temperature set at room temperature or without intentional heating, the crystallinity can be made low.

It is preferable to perform treatment for desorbing water, hydrogen, a component of an organic substance, or the like adsorbed onto a surface of the insulating layer 103 or treatment for supplying oxygen into the insulating layer 103 before formation of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment containing a nitrogen monoxide gas is performed, an organic substance on the surface of the insulating layer 103 can be favorably removed. After such treatment, the metal oxide film is preferably formed successively without exposure of the surface of the insulating layer 103 to the air.

Then, a resist mask 115 is formed over the metal oxide film 108f. After that, part of the metal oxide film 108f that is not covered with the resist mask 115 is etched to form the semiconductor layer 108 (FIG. 7(A)).

For processing of the metal oxide film, either one or both a wet etching method and a dry etching method is used.

<Thinning of Insulating Layer 103>

Then, part of the insulating layer 103 that is not covered with the resist mask 115 is thinned by etching so that the region 103a including a portion that overlaps with the semiconductor layer 108 and the region 103b that does not overlap with the semiconductor layer 108 and is thinner than the region 103a are formed.

For the etching of the insulating layer 103, a dry etching method is preferably used. For example, an anisotropic dry etching method can be used. At this time, the etching conditions and the etching treatment time are set so that the portion to be the region 103b is not eliminated. Moreover, the etching conditions are preferably optimized so that the side surfaces of the region 103a of the insulating layer 103 have curved shapes with the gradients continuously changed.

Here, the insulating layer 103 may have a stacked-layer structure of two insulating films having different etching rates, and a film having a high etching rate may be used as the insulating film, positioned on the upper side, so that only the insulating film, positioned on the upper side is etched to form the region 103b. In that case, the two insulating films included in the insulating layer 103 may be insulating films containing different elements. Alternatively, films containing the same element may be used as the two insulating films, and a film with higher density may be used as the insulating film positioned on the lower side.

Note that although the method in which the etching of the metal oxide film 108f and the etching for thinning the insulating layer 103 are separately performed is described here, these may be collectively performed by one etching treatment. Furthermore, the same etching method (preferably a dry etching method) may be used for both the metal oxide film 108f and the insulating layer 103, and the processing may be successively performed without exposure to the air with different etchants in the same etching apparatus.

After the treatment for thinning the insulating layer 103 is performed, the resist mask 115 is removed.

Here, after the metal oxide film is deposited or processed into the semiconductor layer 108 or after the treatment for thinning the insulating layer 103 is performed, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. It is preferable that the atmosphere of the above heat treatment not contain hydrogen, water, or the like. An electric furnace, an RTA apparatus, or the like can be used for the heat treatment. The use of the RTA apparatus can shorten the heat treatment time.

<Formation of Insulating Film 110f and Metal Oxide Film 114f>

Next, an insulating film 110f and a metal oxide film 114f are formed to cover the insulating layer 103 and the semiconductor layer 108.

The insulating film 110f is to be the gate insulating layer 110 later. As the insulating film 110f, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, the insulating film 110f may be formed by a PECVD method using a microwave.

The metal oxide film 114f is to be the metal oxide layer 114 later. The metal oxide film 114f is preferably formed by a sputtering method in an oxygen-containing atmosphere, for example. Thus, oxygen can be supplied to the insulating film 110f at the time of depositing the metal oxide film 114f.

The above description can be referred to for the case where the metal oxide film 114f is formed by a sputtering method using an oxide target containing a metal oxide as in the case of the semiconductor layer 108.

The metal oxide film 114f may be formed by a reactive sputtering method with a metal target using oxygen as a deposition gas. When aluminum is used for the metal target, an aluminum oxide film can be deposited.

At the time of depositing the metal oxide film 114f, the amount of oxygen supplied into the insulating layer 110 can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure be as close to 100% as possible.

When the metal oxide film 114f is formed by a sputtering method in an oxygen-containing atmosphere in the above manner, oxygen can be supplied to the insulating film 110f and release of oxygen from the insulating film 110f can be prevented during the deposition of the metal oxide film 114f. As a result, an extremely large amount of oxygen can be enclosed in the insulating film 110f. Then, by heat treatment performed later, a large amount of oxygen is supplied to the channel formation region of the semiconductor layer 108, so that oxygen vacancies in the channel formation region can be reduced, and thus the transistor can have high reliability.

In addition, oxygen may be supplied from the insulating film 110f to the semiconductor layer 108 by heat treatment performed after the formation of the metal oxide film 114f. The heat treatment can be performed at a temperature higher than or equal to 200° C. and lower than or equal to 400° C. in an atmosphere containing one or more of nitrogen, oxygen, and a rare gas.

Then, parts of the metal oxide film 114f, the insulating film 110f, and the insulating layer 103 are etched to form an opening reaching the conductive layer 106. Accordingly, the conductive layer 112 to be formed later can be electrically connected to the conductive layer 106 through the opening.

<Formation of Conductive Film 112f>

Next, a conductive film 112f to be the conductive layer 112 is deposited over the metal oxide film 114f (FIG. 8(A)). The conductive film 112f is preferably formed by a sputtering method using a sputtering target of a metal or an alloy.

<Formation of Insulating Layer 110, Metal Oxide Layer 114, and Conductive Layer 112>

Then, a resist mask is formed over the conductive film 112f. After that, the conductive film 112f, the metal oxide film 114f, and the insulating film 110f in a region that is not covered with the resist mask are etched by an anisotropic etching method, and the resist mask is removed (FIG. 8(B)).

The etching of the conductive film 112f, the metal oxide film 114f, and the insulating film 110f may be performed at the same time under the same etching conditions, or may be performed in at least two steps with different etching conditions or methods. For example, the conductive film 112f and the metal oxide film 114f are etched first, and then the insulating film 110f is etched under different etching conditions, whereby etching damage to the semiconductor layer 108 can be reduced.

<Formation of Insulating Layer 116 and Regions 108N>

Next, the insulating layer 116 is formed in contact with the exposed region of the semiconductor layer 108 (FIG. 9(A)).

As the insulating layer 116, a film containing at least one of metal elements such as aluminum, titanium, tantalum, tungsten, chromium, and ruthenium can be used. It is particularly preferable that at least one of aluminum, titanium, tantalum, and tungsten be contained. In particular, it is preferable to use a nitride containing at least one of these metal elements or an oxide containing at least one of these metal elements. As the film having an insulating property, a nitride film such as an aluminum titanium nitride film, a titanium nitride film, or an aluminum nitride film, an oxide film such as an aluminum titanium oxide film, or the like can be favorably used.

Were, the insulating layer 116 is preferably formed by a sputtering method using a nitrogen gas or an oxygen gas as a deposition gas. Accordingly, the film quality can be easily controlled by adjusting the flow rate of the deposition gas.

Subsequently, heat treatment is performed. By the heat treatment, the resistance of regions of the semiconductor layer 108 that are in contact with the insulating layer 116 is lowered, and the regions 108N having low resistance are formed in the semiconductor layer 108 (FIG. 9(B)).

The heat treatment is preferably performed in an inert gas atmosphere such as nitrogen or a rare gas. The temperature of the heat treatment is preferably as high as possible and can be set in consideration of the heat resistance of the substrate 102, the conductive layer 106, the conductive layer 112, and the like. The temperature can be set higher than or equal to 120° C. and lower than or equal to 500° C., preferably higher than or equal to 150° C. and lower than or equal to 450° C., further preferably higher than or equal to 200° C. and lower than or equal to 400° C., still further preferably higher than or equal to 250° C. and lower than or equal to 400° C., for example. When the temperature of the heat treatment is approximately 350° C., for example, the semiconductor device can be manufactured at a high yield with production facilities using a large-sized glass substrate.

Since the insulating layer 116 is not removed here, the heat treatment can be performed any time after the formation of the insulating layer 116. The heat treatment may also serve as another heat treatment or a heating step.

By the heat treatment, oxygen in the semiconductor layer 108 is extracted to the insulating layer 116 side; thus, oxygen vacancies are generated. The oxygen vacancies and hydrogen contained in the semiconductor layer 108 are combined, so that the carrier concentration is increased and the resistance of the regions 108N that is in contact with the insulating layer 116 is reduced.

Alternatively, a metal element contained in the insulating layer 116 is sometimes diffused into the semiconductor layer 108 by the heat treatment, whereby part of the semiconductor layer 108 is alloyed and reduced in resistance in some cases.

Alternatively, nitrogen and hydrogen contained in the insulating layer 116 or nitrogen or the like included in the atmosphere for the heat treatment are sometimes diffused into the semiconductor layer 108 by the heat treatment, whereby their resistance is lowered in some cases.

The regions 108N of the semiconductor layer 108 that have resistance having been lowered because of the above complex action become highly stable low-resistance regions. The regions 108N formed in the above manner are characterized in that the resistance is not easily increased again even if treatment for supplying oxygen is performed in a later step, for example.

Note that although an example in which the insulating layer 116 having an insulating property is used as the layer for forming the regions 108N is described here, the regions 108N may be formed by forming a film having conductivity in contact with regions to be the regions 108N. At this time, it is preferable that after the regions 108N are formed, the film having conductivity be oxidized or nitrided to have an insulating property, so that the insulating layer 116 is obtained. Alternatively, the film may be removed after the formation of the regions 108N, and a structure in which the insulating layer 116 is not provided may be employed.

Alternatively, the regions 108N may be formed by performing treatment for supplying hydrogen to the exposed region of the semiconductor layer 108. In the following description, the insulating layer 116 containing hydrogen is deposited in contact with the exposed region of the semiconductor layer 108, so that hydrogen is supplied.

The insulating layer 116 is preferably formed by a plasma CVD method using a deposition gas containing hydrogen. For example, a silicon nitride film is formed using a deposition gas containing a silane gas and an ammonia gas. Using the ammonia gas in addition to the silane gas enables the film to contain a large amount of hydrogen. Furthermore, hydrogen can be supplied to the exposed portion of the semiconductor layer 108 at the time of the deposition.

It is preferable that heat treatment be performed after the formation of the insulating layer 116 so that part of hydrogen released from the insulating layer 116 is supplied to part of the semiconductor layer 108. It is preferable that the heat treatment be performed at a temperature higher than or equal to 150° C. and lower than or equal to 450° C., preferably higher than or equal to 200° C. and lower than or equal to 400° C. in an atmosphere containing one or more of nitrogen, oxygen, and a rare gas.

By supplying hydrogen as described above, the regions 108N having extremely low resistance can be formed in the semiconductor layer 108. The regions 108N can also be referred to as regions having a higher carrier concentration, regions having a larger number of oxygen vacancies, regions having a higher hydrogen concentration, or regions having a higher impurity concentration than the channel formation region.

Furthermore, oxygen can be supplied from the insulating layer 110 and the insulating layer 103 to the channel formation region of the semiconductor layer 108 by the heat treatment.

<Formation of Insulating Layer 118>

Next, the insulating layer 118 is formed over the insulating layer 116 (FIG. 10(A)).

In the case where the insulating layer 118 is formed by a plasma CVD method and the deposition temperature is too high, depending on the impurity contained in the regions 108N, the impurity might be diffused to a surrounding portion including the channel formation region of the semiconductor layer 108. As a result, the resistance of the channel formation region may be lowered, and the electric resistance of the regions 108N may be increased, for example. The deposition temperature of the insulating layer 116 or the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Formation of the insulating layer 118 at low temperatures enables the transistor to have favorable electrical characteristics even when it has a short channel length.

Furthermore, heat treatment may be performed after the formation of the insulating layer 118.

<Formation of Opening Portion 141a and Opening Portion 141b>

Next, a mask is formed by lithography in a desired position on the insulating layer 118, and then parts of the insulating layer 118 and the insulating layer 116 are etched to form the opening portion 141a and the opening portion 141b reaching the regions 108N.

<Formation of Conductive Layer 120a and Conductive Layer 120b>

Next, a conductive film is deposited over the insulating layer 118 to cover the opening portion 141a and the opening portion 141b, and the conductive film is processed into a desired shape, so that the conductive layer 120a and the conductive layer 120b are formed (FIG. 10(B)).

Through the above process, the transistor 100A can be manufactured.

The above is the description of a modified example of the manufacturing method example.

<Components of Semiconductor Device>

Next, components of the semiconductor device in this embodiment are described in detail.

<Substrate>

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 or the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

<Insulating Layer 103>

The insulating layer 103 can be formed by a sputtering method, a CVD method, an evaporation method, a pulsed laser deposition (PLD) method, or the like as appropriate. In addition, for example, the insulating layer 103 can be formed to have a single layer or stacked layer of an oxide insulating film or a nitride insulating film. To improve the properties of the interface with the semiconductor layer 108, at least a region in the insulating layer 103, which is in contact with the semiconductor layer 108, is preferably formed using an oxide insulating film.

The insulating layer 103 is preferably formed using a film from which oxygen is released by heating.

For example, a single layer or stacked layers using silicon oxide, silicon oxynitride, silicon nitride oxide, silicon nitride, aluminum oxide, hafnium oxide, gallium oxide, a Ga—Zn oxide, or the like can be provided as the insulating layer 103.

In the case where a film other than an oxide film, e.g., a silicon nitride film, is used for the side of the insulating layer 103 that is in contact with the semiconductor layer 108, pretreatment such as oxygen plasma treatment is preferably performed on the surface in contact with the semiconductor layer 108 to oxidize the surface or the vicinity of the surface.

<Conductive Film>

The conductive layer 112 and the conductive layer 106 functioning as gate electrodes, the conductive layer 120a functioning as one of a source electrode and a drain electrode, and the conductive layer 120b functioning as the other electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In-Ga—Zn oxide can also be applied to each of the conductive layer 112, the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Furthermore, among the above metal elements, it is particularly preferable that any one or more metal elements selected from titanium, tungsten, tantalum, and molybdenum be included in the conductive layer 112, the conductive layer 106, the conductive layer 120a, and the conductive layer 120b. It is particularly preferable to use a tantalum nitride film. Since the tantalum nitride film has conductivity and a high barrier property against copper, oxygen, or hydrogen and releases little hydrogen from itself, it can be favorably used as the conductive film in contact with the semiconductor layer 108 or the conductive film in the vicinity of the semiconductor layer 108.

<Insulating Layer 110>

The insulating layer 110 functioning as a gate insulating film of the transistor 100 or the like can be formed by a PECVD method, a sputtering method, or the like. For the insulating layer 110, an insulating layer including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

In addition, the insulating layer 110 that is in contact with the semiconductor layer 108 is preferably an oxide insulating film and further preferably includes a region containing oxygen in excess of that in the stoichiometric composition. In other words, the insulating layer 110 is an insulating film capable of releasing oxygen. It is also possible to supply oxygen into the insulating layer 110 by forming the insulating layer 110 in an oxygen atmosphere, performing heat treatment, plasma treatment, or the like on the deposited the insulating layer 110 in an oxygen atmosphere, or depositing an oxide film over the insulating layer 110 in an oxygen atmosphere, for example.

For the insulating layer 110, a material having a higher relative permittivity than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher relative permittivity than amorphous hafnium oxide.

<Semiconductor Layer>

In the case where the semiconductor layer 108 is an In—M—Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, which facilitates formation of the semiconductor layer 108 having crystallinity. Note that the atomic ratio in the semiconductor layer 108 to be formed varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be formed is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The energy gap of the semiconductor layer 108 is 2 eV or more, preferably 2.5 eV or more. With the use of such a metal oxide having a wider energy gap than silicon, the off-state current of the transistor can be reduced.

Furthermore, the semiconductor layer 108 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) is described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the crystallinity of the oxide semiconductor is lowered in some cases due to the mixing of impurities, formation of defects, or the like; thus, it can also be said that the CAAC-OS is an oxide semiconductor having little amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

In an image obtained with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 μm and less than or equal to 10 nm, or greater than or equal to 1 nm and less than or equal to 3 nm is specifically referred to as a nanocrystal (nc). An oxide semiconductor film including a nanocrystal is referred to as an nc-OS (nanocrystalline oxide semiconductor) film. In an image of the nc-OS film observed with a TEM, for example, a crystal grain boundary cannot be clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS film. Thus, the orientation in the whole film is not observed. Accordingly, the nc-OS film cannot be distinguished from an amorphous oxide semiconductor depending on the analysis method. For example, when the nc-OS film is subjected to structural analysis by an out-of-plane method with an XRD apparatus using an X-ray having a diameter larger than the diameter of a crystal part, a peak indicating a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, in some cases, a circular (ring-like) region with high luminance is observed in an electron diffraction pattern (also referred to as nanobeam electron diffraction pattern) of the nc-OS film, which is obtained using an electron beam with a probe diameter close to or smaller than the diameter of a crystal part (e.g., 1 μm or larger and 30 nm or smaller), and spots are observed in the ring-like region.

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier density and higher electron mobility than the CAAC-OS film in some cases. Accordingly, a transistor including the nc-OS film may have high field-effect mobility.

The nc-OS film can be formed at a smaller oxygen flow rate ratio in formation than the CAAC-OS film. The nc-OS film can also be formed at a lower substrate temperature in formation than the CAAC-OS film. For example, the nc-OS film can be formed at a relatively low substrate temperature (e.g., a temperature of 130° C. or lower) or without heating of the substrate and thus is suitable for a large-sized glass substrate, a resin substrate, or the like, and productivity can be increased.

An example of a crystal structure of a metal oxide is described. Note that a metal oxide deposited by a sputtering method using an In—Ga—Zn oxide target (In:Ga:Zn=4:2: 4.1 [atomic ratio]) is described below as an example. A metal oxide that is deposited by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated intentionally.

<Composition of Metal Oxide>

The composition of a CAC (Cloud-Aligned Composite)-OS that can be used in a transistor disclosed in one embodiment of the present invention is described below.

Note that in this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 μm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

The above is the description of each of the components.

At least part of this embodiment can be implemented in combination with the other embodiments described in this specification as appropriate.

Embodiment 2

In this embodiment, an example of a display device that includes any of the transistors described in the above embodiment is described.

[Structure Example]

Figure 11A:
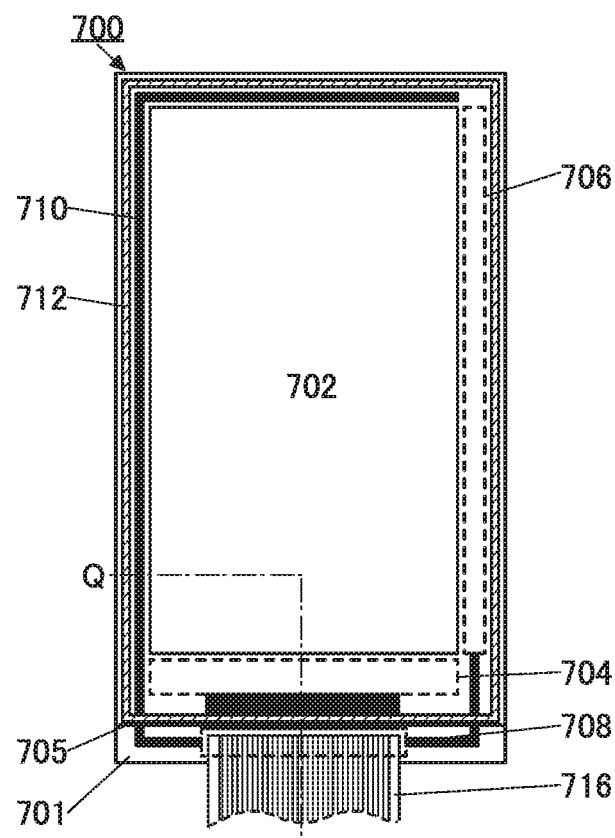
FIGS. 11 (A), (B), and (C) Top views of display devices.

FIG. 11(A) is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Figure 11B:
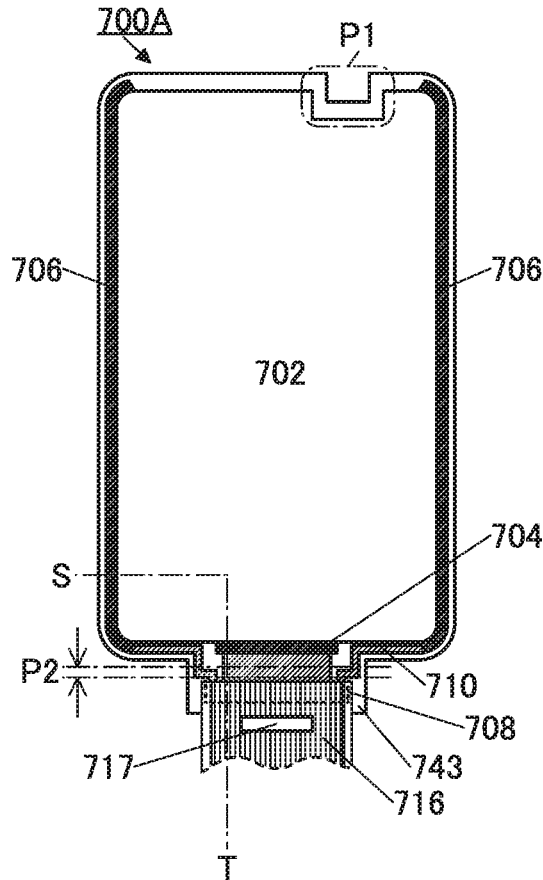

A display device 700A illustrated in FIG. 11(B) is an example of a display device which includes a flexible resin layer 743 instead of the first substrate 701 and can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as shown in a region P1 in FIG. 11(B). A pair of gate driver circuit portions 706 is provided on the opposite sides with the pixel portion 702 therebetween. The gate driver circuit portions 706 are provided along a curved outline at the corners of the pixel portion 702.

The resin layer 743 has a protrusion where the FPC terminal portion 708 is provided. Furthermore, part of the resin layer 743 that includes the FPC terminal portion 708 can be bent backward in a region P2 in FIG. 11(B). When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

Figure 11C:
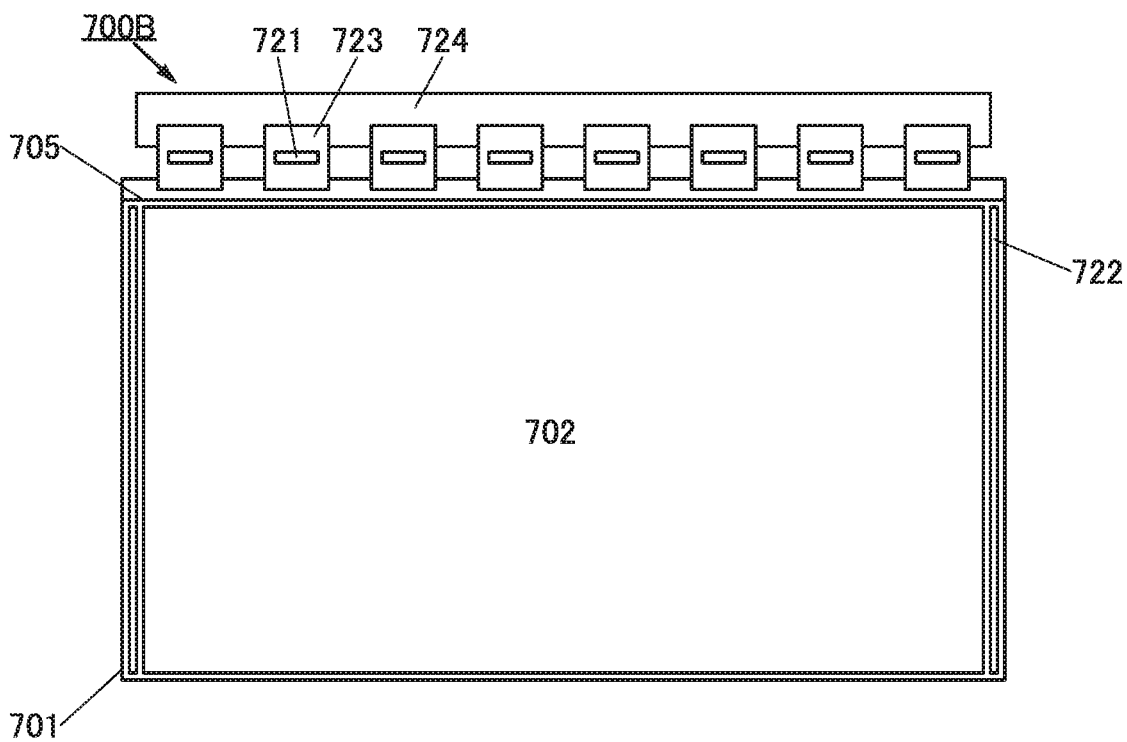

A display device 700B illustrated in FIG. 11(C) is a display device that can be suitably used for an electronic device with a large screen. For example, the display device 700B can be suitably used for a television device, a monitor device, a personal computer (including a laptop type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the substrate 701. Thus, an electronic device with a narrow bezel can be provided.

With such a structure, a large-size and high-resolution display device can be provided. For example, use in a display device with a screen diagonal of 30 inches or more, 40 inches or more, 50 inches or more, or 60 inches or more is possible. Furthermore, a display device with extremely high resolution such as 4K2K or 8K4K can be provided.

[Cross-Sectional Structure Example]

Figure 12:
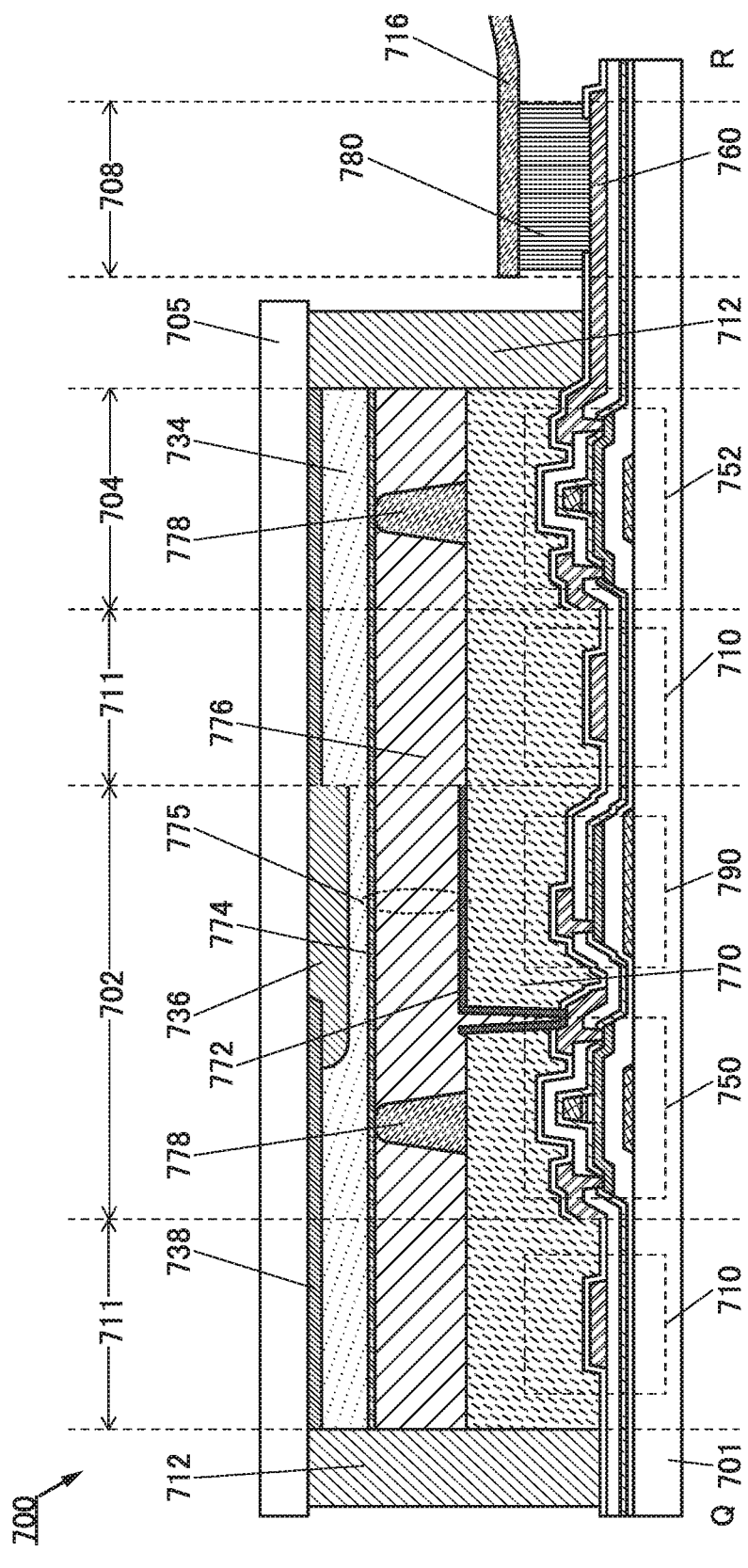
FIG. 12 A cross-sectional view of the display device.
Figure 13:
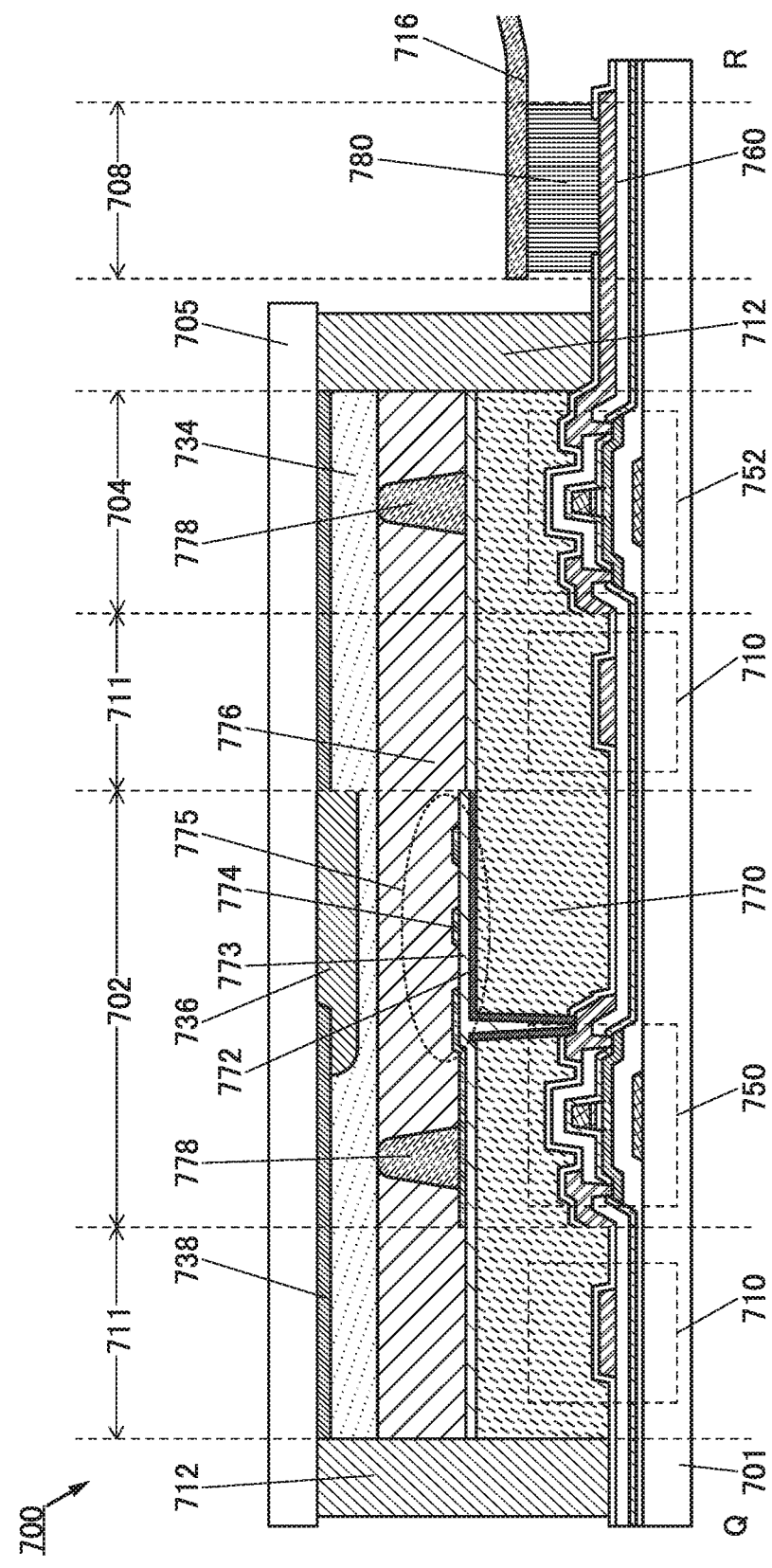
FIG. 13 A cross-sectional view of the display device.
Figure 14:
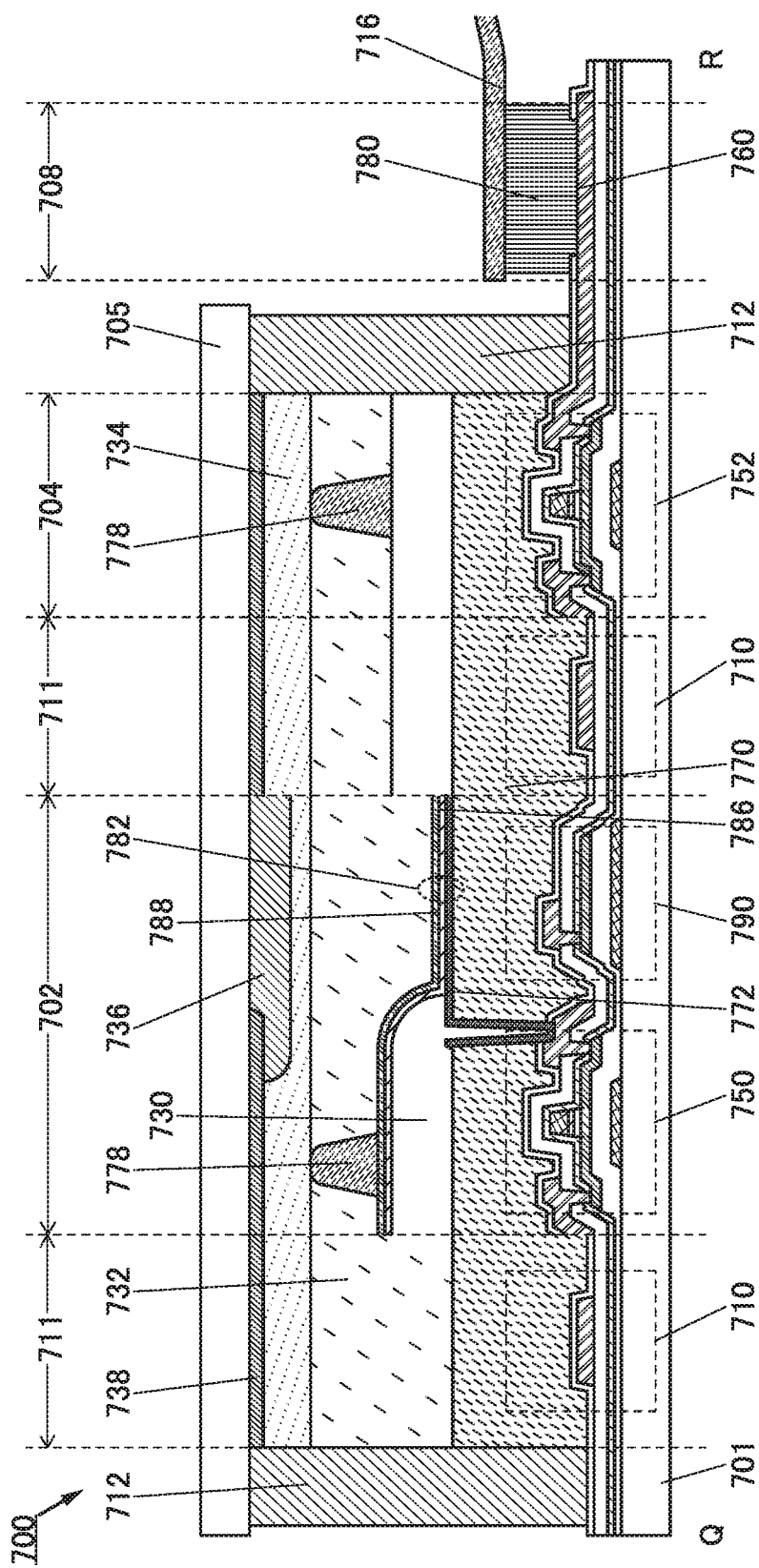
FIG. 14 A cross-sectional view of the display device.
Figure 15:
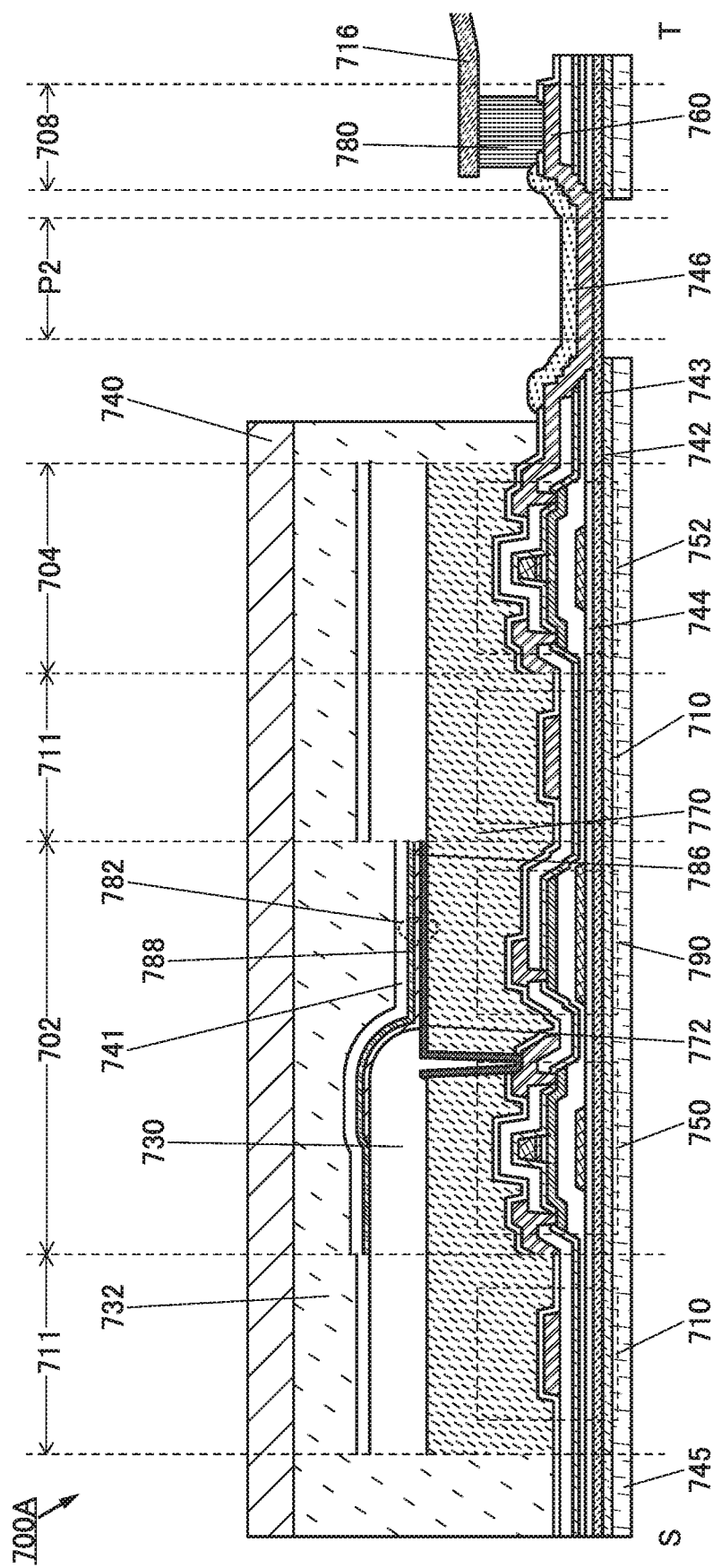
FIG. 15 A cross-sectional view of the display device.

Structures using a liquid crystal element or an EL element as a display element are described below with reference to FIG. 12 to FIG. 15. Note that FIG. 12 to FIG. 14 are cross-sectional views taken along dashed-dotted line Q-R in FIG. 11(A). FIG. 15 is a cross-sectional view taken along dashed-dotted line S-T in the display device 700A in FIG. 11(B). FIG. 12 and FIG. 13 are each a structure using a liquid crystal element as a display element, and FIG. 14 and FIG. 15 are each a structure using an EL element.

<Description of Common Portions in Display Devices>

Display devices in FIG. 12 to FIG. 15 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 13 shows a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is inhibited. The transistor can have low off-state current. Accordingly, an electrical signal such as an image signal can be held for a longer period, and the interval between writes of an image signal and the like can be set longer. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 in each of FIG. 12, FIG. 14, and FIG. 15 includes a lower electrode formed by processing the same film as a film used for the first gate electrode of the transistor 750 and an upper electrode formed by processing the same metal oxide film as a film used for the semiconductor layer. The resistance of the upper electrode is reduced as well as those of a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a film used for a source electrode and a drain electrode of the transistor is connected to the upper electrode.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the gate driver circuit portion 706 is similar to the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

<Structure Example of Display Device Using Liquid Crystal Element>

The display device 700 illustrated in FIG. 12 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light (also referred to as a light-transmitting material) or a material that reflects visible light (also referred to as a reflective material) can be used for the conductive layer 772. As the light-transmitting material, for example, an oxide material including indium, zinc, tin, or the like is preferably used. As the reflective material, for example, a material including aluminum, silver, or the like is preferably used.

When a reflective material is used for the conductive layer 772, the display device 700 is a reflective liquid crystal display device. When a light-transmitting material is used for the conductive layer 772, the display device 700 is a transmissive liquid crystal display device. For a reflective liquid crystal display device, a polarizing plate is provided on the viewer side. By contrast, for a transmissive liquid crystal display device, a pair of polarizing plates is provided so that the liquid crystal element is placed therebetween.

The display device 700 in FIG. 13 is an example of employing the liquid crystal element 775 of a horizontal electric field mode (e.g., an FFS mode). The conductive layer 774 functioning as a common electrode is provided over the conductive layer 772 with an insulating layer 773 therebetween, An electric field generated between the conductive layer 772 and the conductive layer 774 can control the alignment state in the liquid crystal layer 776.

In FIG. 13, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 12 and FIG. 13, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

<Display Device Using Light-Emitting Element>

The display device 700 illustrated in FIG. 14 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 shown in FIG. 14, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 15 illustrates a structure of a display device suitably applicable to a flexible display. FIG. 15 is a cross-sectional view taken along the dashed-dotted line S-T in the display device 700A in FIG. 11(B).

The display device 700A in FIG. 15 has a structure in which a support substrate 745, a bonding layer 742, the resin layer 743, and an insulating layer 744 are stacked instead of the substrate 701 in FIG. 14. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 15 includes a protective layer 740 instead of the substrate 705 in FIG. 14. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 15 shows the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When an inorganic insulating film is not provided in the region P2 that can be bent and only a conductive layer containing a metal or an alloy and a layer containing an organic material are stacked, generation of cracks at the time of bending can be prevented. When the support substrate 745 is not provided in the region P2, part of the display device 700A can be bent with an extremely small radius of curvature.

<Structure Example of Display Device Provided with Input Device>

An input device such as a touch sensor may be provided in the display device 700 or the display device 700A illustrated in FIG. 12 to FIG. 15. An example of the input device includes a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include a so-called in-cell touch panel in which an input device is provided inside a pair of substrates, a so-called on-cell touch panel in which an input device is formed over the display device 700, or a so-called out-cell touch panel in which an input device is attached to the display device 700.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes the semiconductor device of one embodiment of the present invention is described with reference to FIGS. 16(A), 16(B), and 16(C).

Figure 16A:
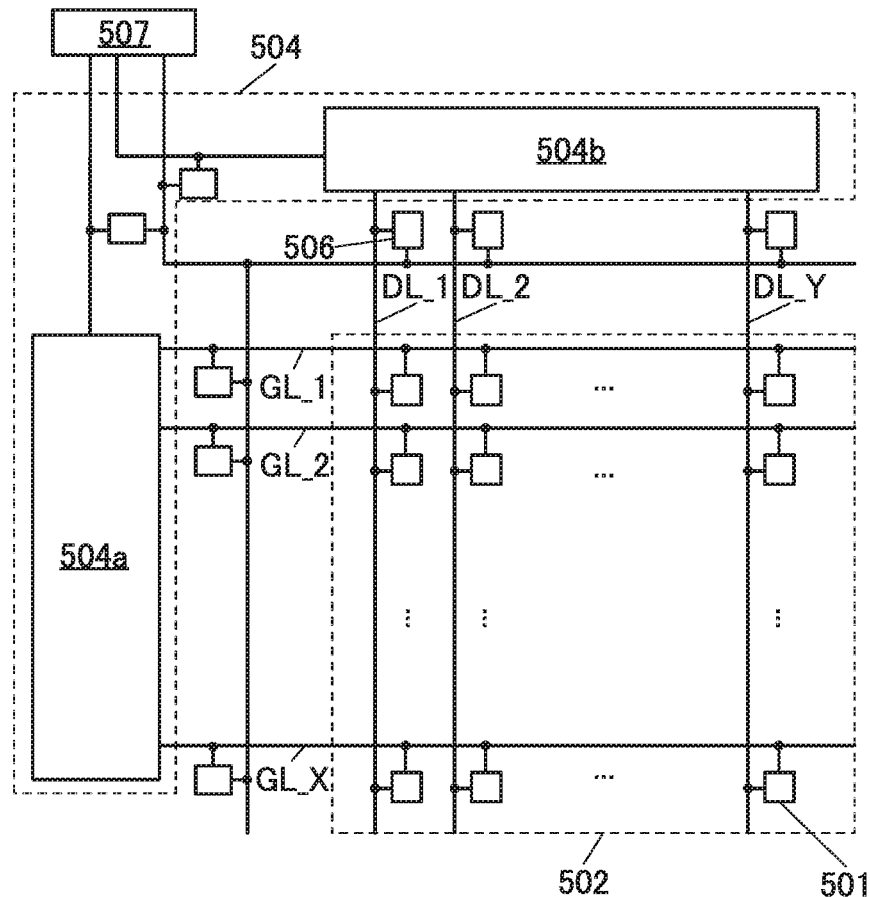
FIG. 16 (A) A block diagram of a display device and (B) and (C) circuit diagrams.

A display device illustrated in FIG. 16(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 16(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where the gate driver 504a or the source driver 504b is separately formed (e.g., a driver circuit board formed using a single crystal semiconductor film or a polycrystalline semiconductor film) may be mounted on the substrate by COG or TAB (Tape Automated Bonding).

Figure 16B:
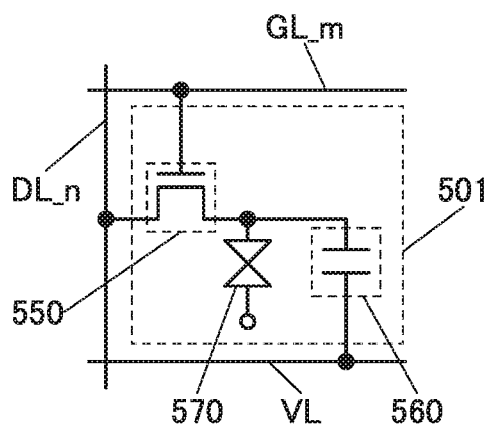
Figure 16C:
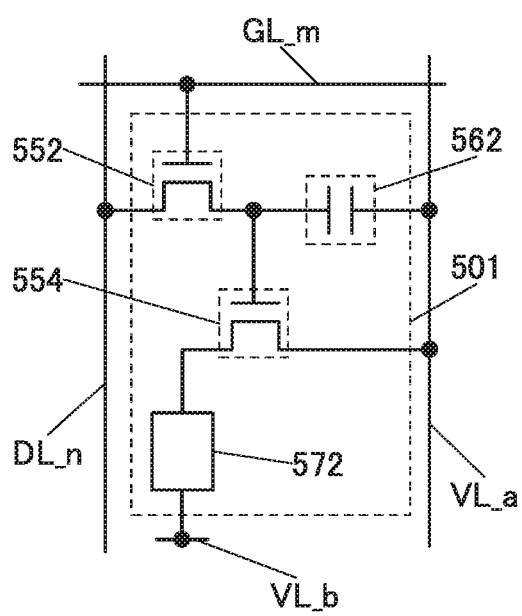

The plurality of pixel circuits 501 illustrated in FIG. 16(A) can have a configuration illustrated in FIG. 16(B) or 16(C), for example.

The pixel circuit 501 illustrated in FIG. 16(B) includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The aliment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 16(C) includes transistors 552 and 554, a capacitor 562, and a light-emitting element 572. The data line DL_n, the scan line GL_m, a potential supply line VL_a, a power supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit are described below. The transistor described in Embodiment 1 can be used as a transistor used in the pixel circuit described below.

[Circuit Configuration]

Figure 17A:
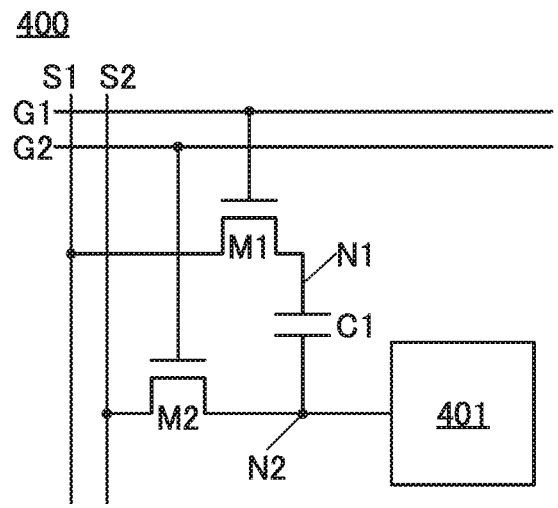
FIGS. 17 (A), (C), and (D) Circuit diagrams of display devices and (B) a timing chart.

FIG. 17(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 17B:
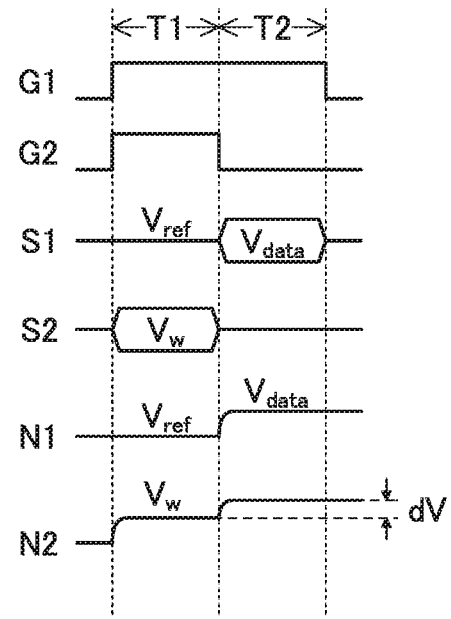

Next, an example of a method for operating the pixel circuit 400 is described with reference to FIG. 17(B). FIG. 17(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 17(B), one frame period is divided into a period T1 and a period T2. The period T1 is a period in which a potential is written to the node N2, and the period T2 is a period in which a potential is written to the node N1.

<Period T1>

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

<Period T2>

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 17(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

<Example Using Liquid Crystal Element>

Figure 17C:
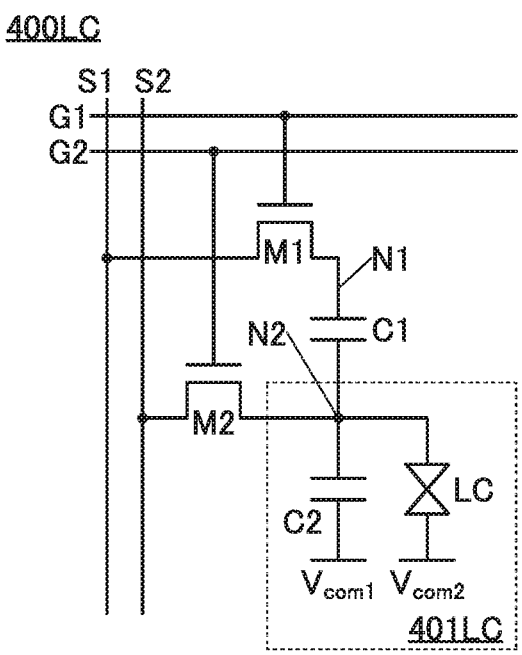

A pixel circuit 400LC illustrated in FIG. 17(C) includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

<Example Using Light-Emitting Element>

Figure 17D:
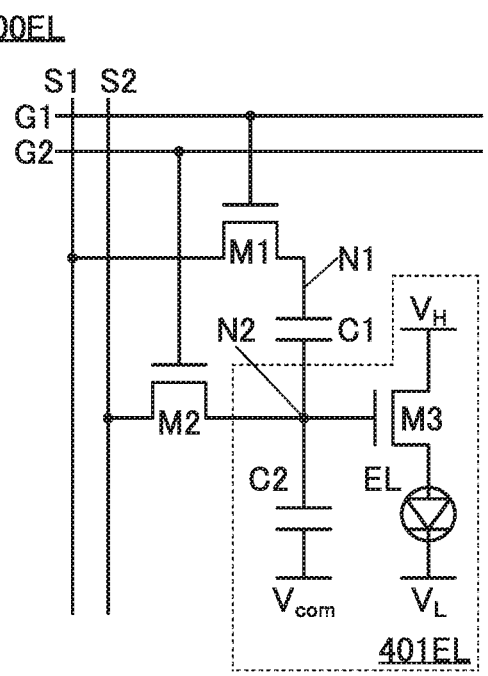

A pixel circuit 400EL illustrated in FIG. 17(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential VH, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, variation in the electrical characteristics of the transistor M3 and the light-emitting element EL can be corrected by supply of a correction signal to the wiring S1 or the wiring S2.

Note that the configuration is not limited to the circuits shown in FIGS. 17(C) and 17(D), and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention is described.

Figure 18A:
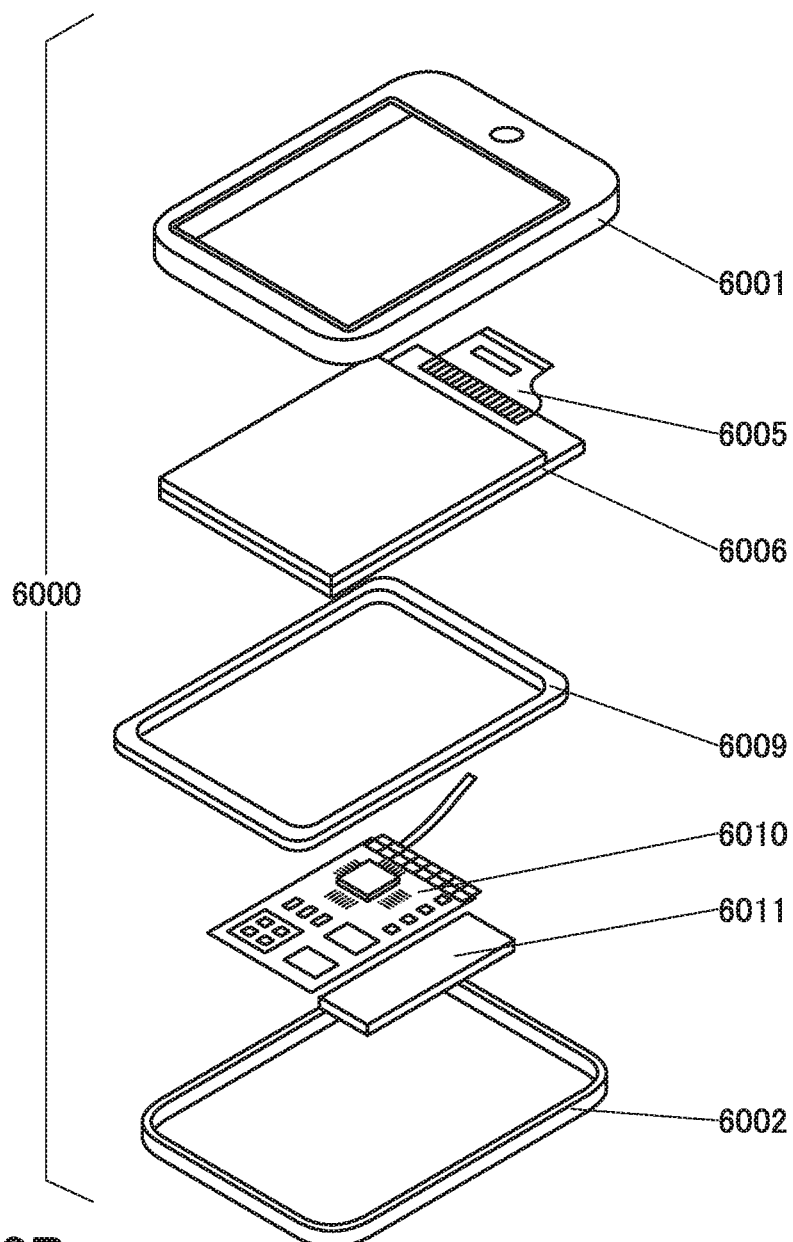
FIGS. 18 (A) and (B) A structure example of a display module.

In a display module 6000 illustrated in FIG. 18(A), a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. The power supply may be from the battery 6011.

Figure 18B:
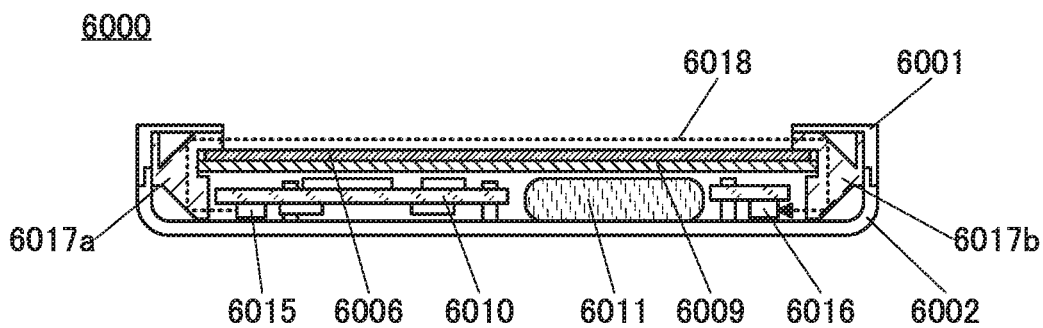

FIG. 18(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017*a* and a light guide portion 6017*b*) are provided in regions surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017*a* and the light guide portion 6017*b*.

Light 6018 emitted from the light-emitting portion 6015 travels over the display device 6006 through the light guide portion 6017*a* and reaches the light-receiving portion 6016 through the light guide portion 6017*b*. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017*a* and the light guide portion 6017*b* which transmit the light 6018, the light-emitting portion 6015 and the light-receiving portion 6016 can be placed under the display device 6006, and a malfunction of the touch sensor due to external light reaching the light-receiving portion 6016 can be inhibited. Particularly when a resin that absorbs visible light and transmits infrared rays is used for the light guide portion 6017*a* and the light guide portion 6017*b*, a malfunction of the touch sensor can be inhibited more effectively.

At least part of this embodiment can be implemented in combination with the other embodiments described in this specification as appropriate.

Embodiment 6

In this embodiment, examples of an electronic device for which the display device of one embodiment of the present invention can be used are described.

Figure 19A:
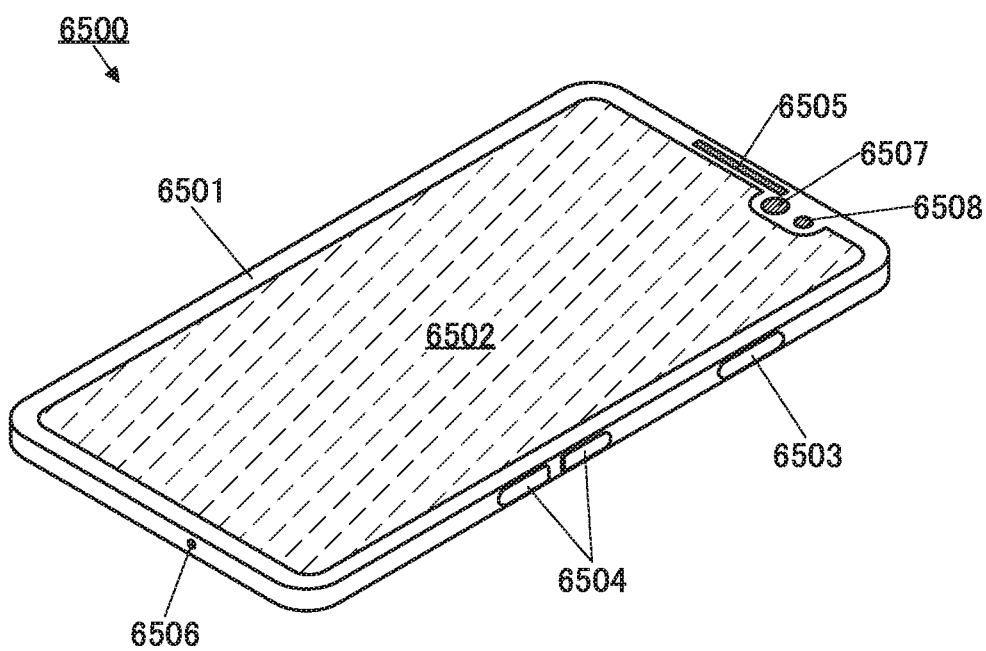
FIGS. 19 (A) and (B) A structure example of an electronic device.

An electronic device 6500 illustrated in FIG. 19(A) is a portable information terminal that can be used as a smartphone.

The electronic device 6500 includes, in a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 19B:
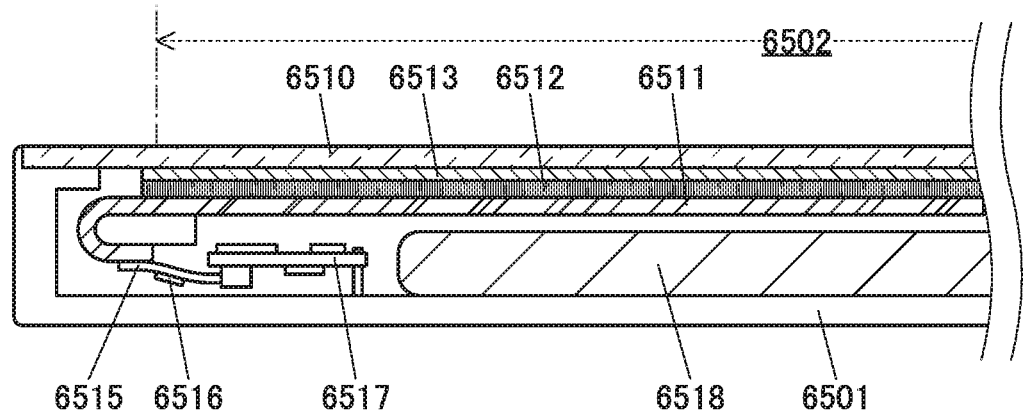

FIG. 19(B) is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with any of the other embodiments described in this specification as appropriate.

Embodiment 7

In this embodiment, electronic devices each including a display device manufactured using one embodiment of the present invention are described.

Electronic devices exemplified below include a display device of one embodiment of the present invention in a display portion. Thus, the electronic device achieves high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a laptop personal computer, a monitor device, digital signage, a pachinko machine, or a game machine.

The electronic device using one embodiment of the present invention can be incorporated along a flat surface or a curved surface of an inside wall or an outside wall of a house or a building, an interior or an exterior of a car, or the like.

Figure 20A:
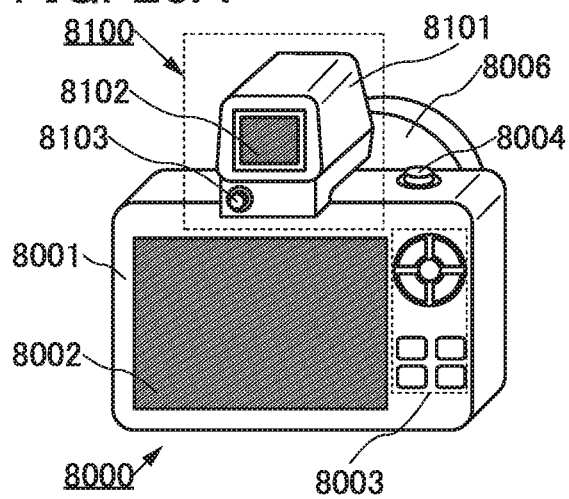
FIG. 20 (A) to (B) Structure examples of electronic devices.

FIG. 20(A) is a diagram showing appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that, in addition to the finder 8100, a stroboscope or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video received from the camera 8000 and the like on the display portion 8102.

The button 8103 functions as a power button or the like.

The display portion 8002 of the camera 8000 and the display portion 8102 of the finder 8100 can use a display device of one embodiment of the present invention. Note that a finder may be incorporated in the camera 8000.

Figure 20B:
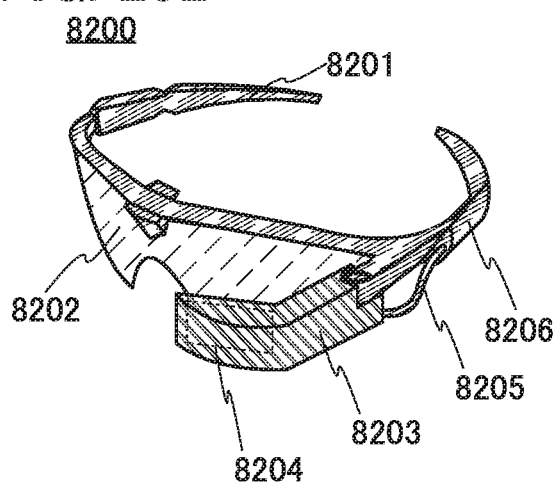

FIG. 20(B) is a diagram showing appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user to achieve a function of recognizing the user's sight line. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display portion 8204 can use the display device of one embodiment of the present invention.

Figure 20C:
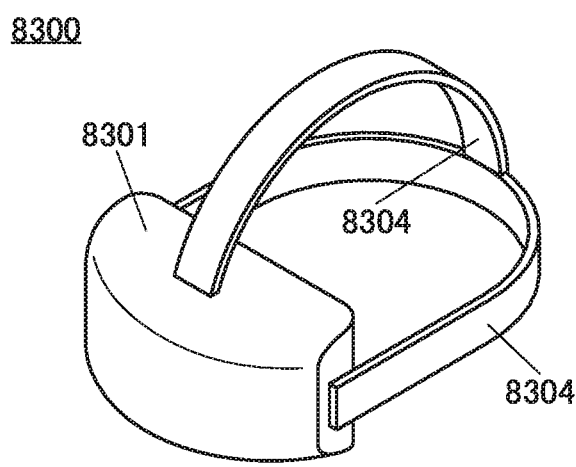
Figure 20D:
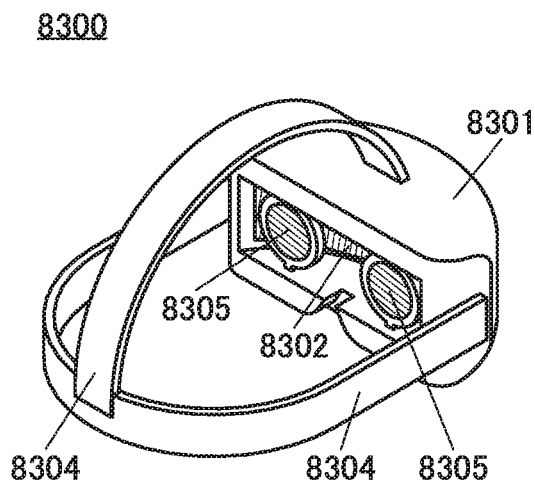
Figure 20E:
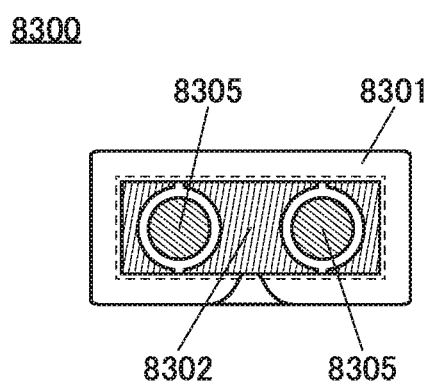

FIGS. 20(C), 20(D), and 20(E) are diagrams showing appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 20(E), the user does not perceive pixels, and a more realistic video can be displayed.

Electronic devices illustrated in FIG. 21(A) to FIG. 21(G) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 21(A) to FIG. 21(G) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (external or incorporated in the camera), a function of displaying the taken image on the display portion, or the like.

The details of the electronic devices illustrated in FIG. 21(A) to FIG. 21(G) are described below.

Figure 21A:
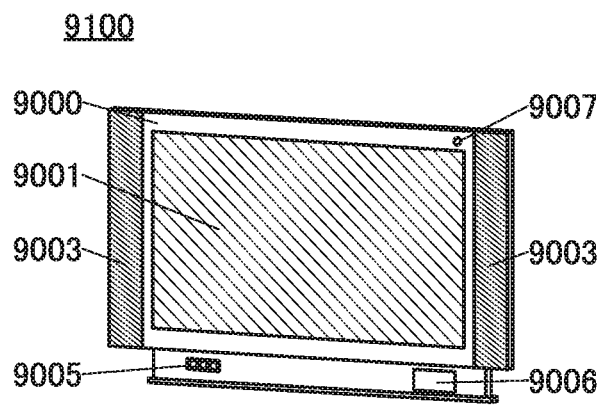
FIG. 21 (A) to (G) Structure examples of electronic devices.

FIG. 21(A) is a perspective view showing a television device 9100. The television device 9100 can include the display portion 9001 having a large screen size of, for example, 50 inches or more, or 100 inches or more.

Figure 21D:
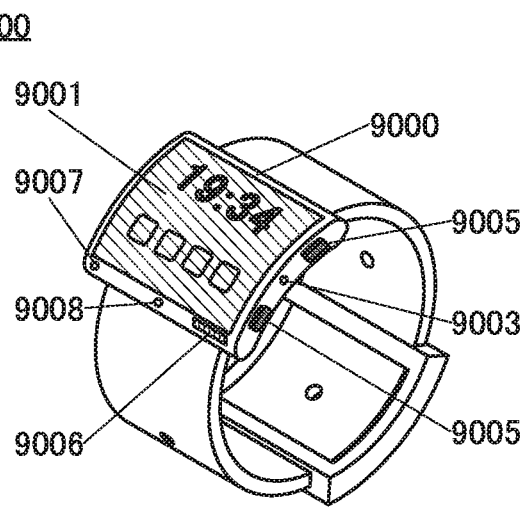
Figure 21B:
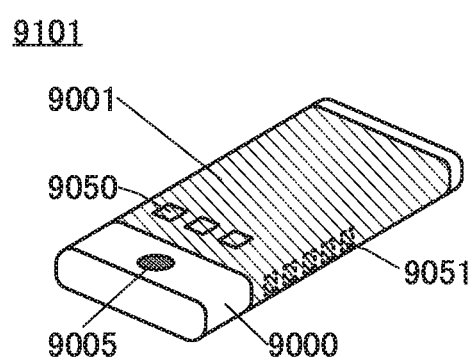

FIG. 21(B) is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 21(B) shows an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed in the position where the information 9051 is displayed.

Figure 21E:
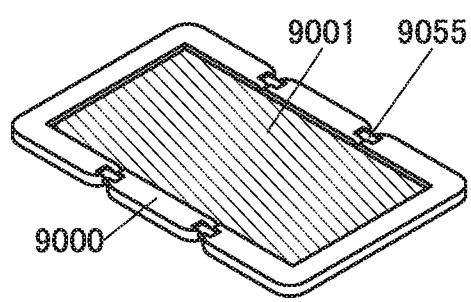
Figure 21C:
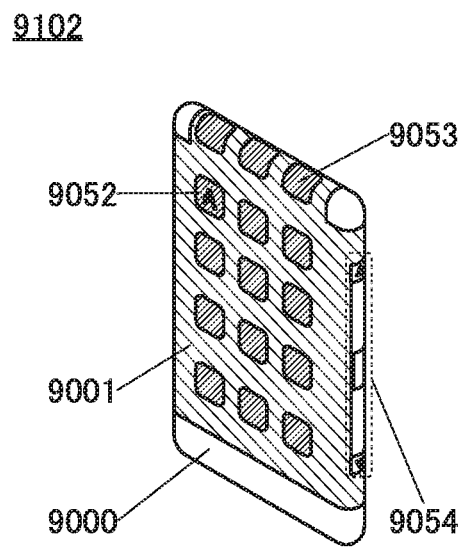

FIG. 21(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 21(D) is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 21F:
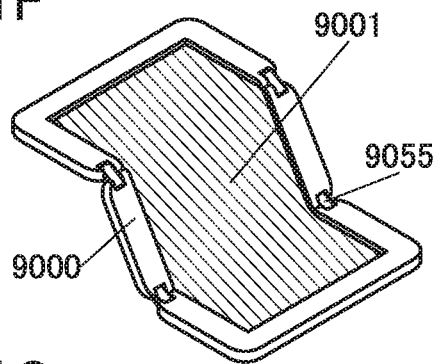
Figure 21G:
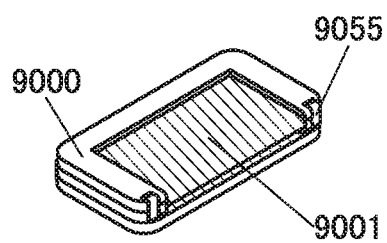

FIGS. 21(E), 21(F), and 21(G) are perspective views showing a foldable portable information terminal 9201. FIG. 21(E) is a perspective view of an opened state of the portable information terminal 9201, FIG. 21(G) is a perspective view of a folded state thereof, and FIG. 21(F) is a perspective view of a state in the middle of change from one of FIG. 21(E) and FIG. 21(G) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figure 22A:
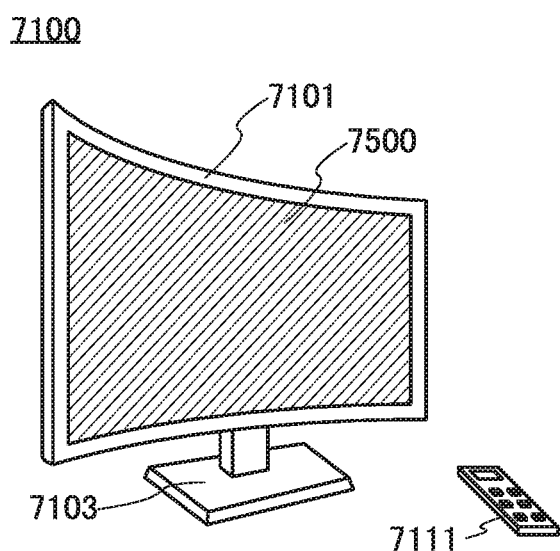
FIG. 22 (A) to (D) Structure examples of electronic devices.

FIG. 22(A) shows an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 22(A) can be performed with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for a network connection.

Figure 22B:
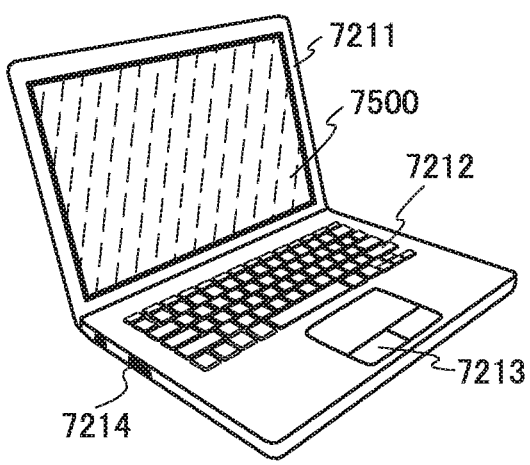

FIG. 22(B) illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 22C:
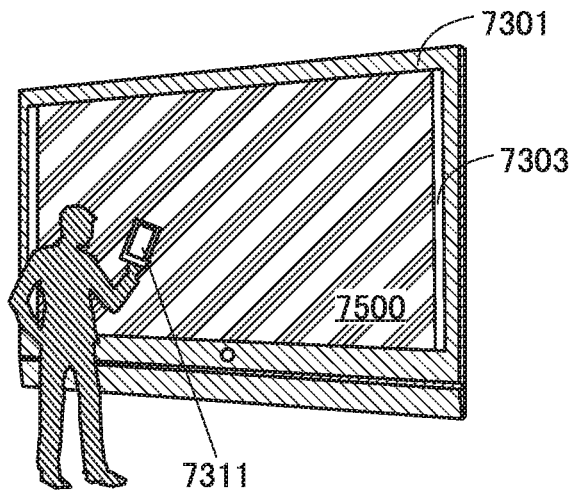
Figure 22D:
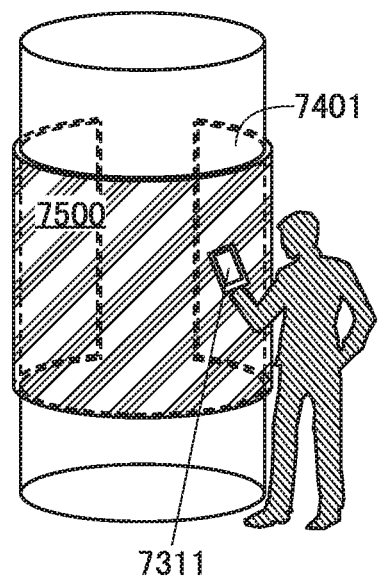

FIGS. 22(C) and 22(D) show examples of digital signage. Digital signage 7300 illustrated in FIG. 22(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 22(D) is digital signage 7400 attached to a cylindrical pillar 7401. The digital signage 7400 includes the display portion 7500 provided along a curved surface of the pillar 7401.

The larger display portion 7500 can increase the amount of data that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIGS. 22(C) and 22(D), it is preferable that the digital signage 7300 or the digital signage 7400 can work with an information terminal 7311 such as user's smartphone through wireless communication. For example, information of an advertisement displayed on the display portion 7500 can be displayed on a screen of the information terminal 7311. By operation of the information terminal 7311, display on the display portion 7500 can be switched.

It is possible to make the digital signage 7300 or the digital signage 7400 execute a game with the use of the information terminal 7311 as an operation means (controller). Thus, an unspecified number of users can join in and enjoy the game concurrently.

The display portion 7500 in FIGS. 22(A) to 22(D) can use the display device of one embodiment of the present invention.

The electronic devices of this embodiment each include a display portion; however, one embodiment of the present invention can also be used in an electronic device without a display portion.

At least part of this embodiment can be implemented in combination with the other embodiments described in this specification as appropriate.

REFERENCE NUMERALS

100, 100A to 100C: transistor, 102: substrate, 103: insulating layer, 103*a*, 103*b*: region, 106: conductive layer, 108, 108*a*, 108*b*: semiconductor layer, 108*f*: metal oxide film, 108L: layer, 108N: region, 110: insulating layer, 110*f*: insulating film, 112: conductive layer, 112*f*: conductive film, 114: metal oxide layer, 114*f*: metal oxide film, 115: resist mask, 116, 118: insulating layer, 120*a*, 120*b*: conductive layer, 141*a*, 141*b*, 142: opening

The invention claimed is:
1. A semiconductor device comprising a semiconductor layer; a first insulating layer; a second insulating layer; a third insulating layer; a first conductive layer; and a metal oxide layer,
wherein the semiconductor layer is over the first insulating layer,
wherein a part of the first insulating layer that overlaps with the semiconductor layer protrudes in a thickness direction, and the first insulating layer includes a first region that overlaps with the semiconductor layer and a second region that does not overlap with the semiconductor layer and is thinner than the first region, wherein the second insulating layer covers a top surface of the second region, a side surface of the first region, and a top surface and a side surface of the semiconductor layer, wherein the metal oxide layer is over the second insulating layer, wherein the first conductive layer is over the metal oxide layer, and a bottom surface of the first conductive layer over the second region includes a portion positioned below a bottom surface of the semiconductor layer, wherein the semiconductor layer includes a third region overlapping with the second insulating layer, the metal oxide layer, and the first conductive layer and a fourth region not overlapping with the first conductive layer, the metal oxide layer, and the second insulating layer, wherein the third insulating layer is in contact with the fourth region of the semiconductor layer, wherein the semiconductor layer and the metal oxide layer comprise a metal oxide comprising indium and gallium, wherein a content ratio of gallium in the metal oxide layer is higher than a content ratio of gallium in the semiconductor layer, and wherein the third insulating layer comprises a nitride.

2. The semiconductor device according to claim 1, wherein in the first insulating layer, a thickness of the first region is 1.2 times to 10 times a thickness of the second region.

3. The semiconductor device according to claim 1, wherein in the first insulating layer a gradient of the side surface of the first region is continuously changed so that the side surface of the first region and the top surface of the second region are continuously connected.

4. The semiconductor device according to claim 1, wherein the first conductive layer includes a portion whose top surface is below the bottom surface of the semiconductor layer.

5. The semiconductor device according to claim 1, wherein the semiconductor layer has a stacked-layer structure in which a first metal oxide film and a second metal oxide film are stacked in this order, and wherein the second metal oxide film has higher crystallinity than the first metal oxide film.

6. The semiconductor device according to claim 1, wherein the semiconductor layer includes a first metal oxide film and a second metal oxide film, wherein the first metal oxide film is over the first region, wherein the second metal oxide film is in contact with the side surface of the first region and a side surface and a top surface of the first metal oxide film, and wherein the second metal oxide film has higher crystallinity than the first metal oxide film.

7. The semiconductor device according to claim 1, wherein the third insulating layer contains nitrogen and one or more elements selected from aluminum, titanium, tantalum, tungsten, chromium, and ruthenium, and wherein the fourth region of the semiconductor layer contains indium.

8. The semiconductor device according to claim 1, wherein the third insulating layer contains silicon, nitrogen, and hydrogen.

9. The semiconductor device according to claim 1, wherein a length in a channel length direction of a region of the first conductive layer that overlaps with the semiconductor layer is greater than or equal to 2 µm and less than or equal to 3 µm.

10. The semiconductor device according to claim 1, wherein a length in a channel width direction of a region of the semiconductor layer that is covered with the first conductive layer is greater than or equal to 1 µm and less than or equal to 100 µm.

* * * * *